United States Patent [19]
Tau et al.

[11] Patent Number: 5,751,581
[45] Date of Patent: May 12, 1998

[54] MATERIAL MOVEMENT SERVER

[75] Inventors: Lok L. Tau, Austin; Michael R. Conboy, Buda; Thomas P. Jackson, Bastrop, all of Tex.

[73] Assignee: Advanced Micro Devices, Austin, Tex.

[21] Appl. No.: 558,962

[22] Filed: Nov. 13, 1995

[51] Int. Cl.$^6$ .................................................. G06F 19/00
[52] U.S. Cl. ........................... 364/468.22; 364/468.28; 364/478.13
[58] Field of Search ..................... 364/468.02, 468.28, 364/468.22, 468.23, 468.19, 468.2, 478.13–478.17, 478.07; 414/273; 235/375

[56] References Cited

U.S. PATENT DOCUMENTS 5,231,585 7/1993 Kobayashi et al. ............... 364/468.02
5,536,128 7/1996 Shimoyashiro et al. ............ 414/273
5,537,325 7/1996 Iwakiri et al. .................... 364/468.28

Primary Examiner—Paul P. Gordon
Assistant Examiner—Steven R. Garland
Attorney, Agent, or Firm—Merchant, Gould, Smith, Edell, Welter & Schmidt, P.A.

[57] ABSTRACT

A method for tracking products within a sequence of processes. The products are moved in carriers through the sequence and the products are initially arranged in groups. The products may be moved between different carriers during the sequence. The method includes the steps of: (a) assigning a first set of identification numbers to the products, a second set of identification numbers to the groups, and a third set of identification numbers to the carriers; and (b) tracking the movement of products through the sequence using the second set of identification numbers, tracking the movement of carriers using the third set of identification numbers, and synchronizing the movement of the products and the carriers.

19 Claims, 9 Drawing Sheets

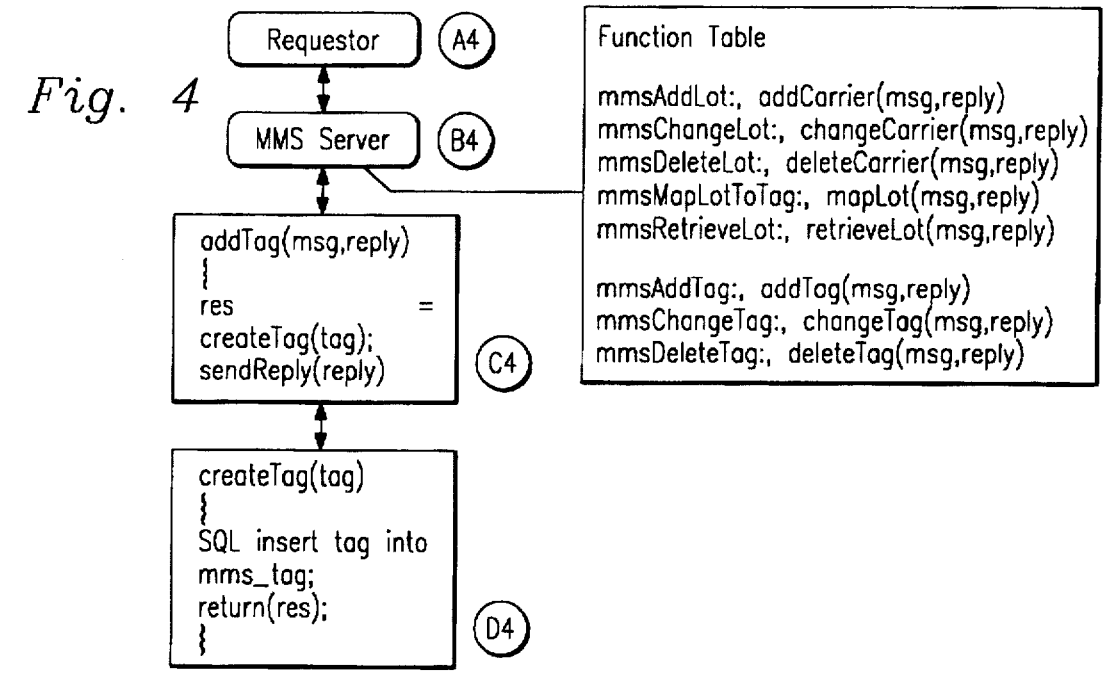
Fig. 4
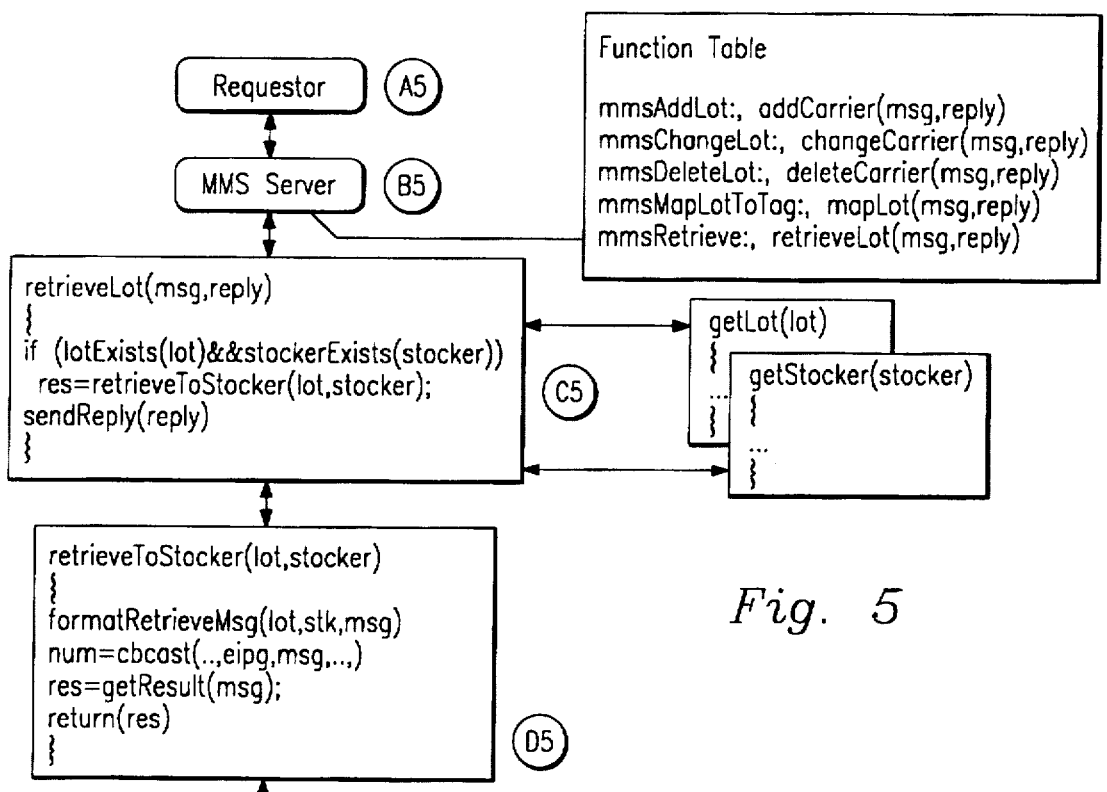
Fig. 5
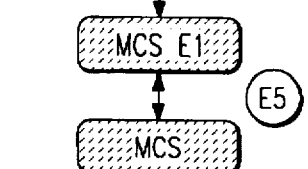

MATERIAL MOVEMENT SERVER

BACKGROUND OF THE INVENTION

This invention relates generally to the fabrication of integrated circuits on semiconductor wafers, and more particularly to the physical logistics of moving wafers for processing during the fabrication.

A fabrication plant is usually divided into separate areas for particular portions of the fabrication process. Each processing area is called a "bay". Each bay contains equipment that is required to process wafers for a certain purpose. In addition to the equipment, "material stockers" are present near the bay. The material stocker is a large automated cabinet where wafers are stored while waiting to be processed. The wafers are stored in "cassettes", and each cassette can hold up to twenty-five wafers. A "lot" is a logical grouping of wafers in a cassette. The lot can migrate from cassette to cassette as it progresses through the chain of production processes.

A material stocker can hold hundreds of cassettes. A material stocker services two bays. When a cassette of wafers is ready to be stored in a material stocker, the operator places the cassette at one of the input ports of the material stocker.

When an operator wishes to retrieve a lot from a material stocker, he issues a request via the application program of the host computer. The operator may need empty cassettes to configure or process the wafers. Empty cassettes may be stored in a material stocker, so the operator must have the capability to request empty cassettes. In addition to manipulation of the wafers, the operator may also need to manipulate, or set up, the equipment for an operation.

Once a lot has been retrieved, and the equipment has been set up, the operation on the wafers by a particular piece of equipment, or "tool", can begin. At this point, the lot is "moved-in" to the operation. This state is indicated to the host application by the operator for the lot. The lot remains in this state until the operation is completed. Once the operation is completed, the operator must perform tests and verifications on the wafers. When all tests and verifications have been performed, the host computer application program must be notified. Wafers may have moved from one cassette to another as a result of the operation. The host application has to be notified of this. The operator then places the cassette of "moved-out" wafers in the material stocker, to await orders as to the location of the next piece of equipment which will perform operations on the wafers.

Daifuku, located in Komaki, Japan, sells an automated material handling system which tracks and moves wafers by physical cassettes. Consilium, Inc., located in Mountain View, Calif., sells a shopfloor control computer program, called "WorkStream", for controlling the manufacturing process of the wafers. WorkStream tracks the handling of wafers by the logical lots, and tracks operations on those lots. The next generation system sold by Consilium is called "DFS", for "Distributed Factory System". ISIS Distributed Systems, Inc., located in Marlboro, Mass., sells a message bus protocol named "ISIS" that serves as a communication protocol for Workstream and the interfaces for the process tools.

What is needed is a computer program that can mesh the automated material handling system with the Workstream program, and use the ISIS message bus protocol. A system is needed to allow a requester to retrieve a cassette ID for a given lot ID or retrieve a lot ID for a given cassette ID.

More specifically, a system is needed to provide facilities for accessing lot and carrier data for shop floor control, to provide protocols to external entities to facilitate movement of the wafers on the shop floor, to provide user interfaces for ad-hoc use by the operators, to be sensitive to time-out values when interacting with the material stocker—equipment interface, and to use the ISIS message bus for communication with the host computers.

SUMMARY OF THE INVENTION

The foregoing problems are solved and a technical advance is achieved by the provision of a method for tracking products within a sequence of processes, in which the products are moved in carriers through the sequence and the products are initially arranged in groups, and wherein the products are moved between different carriers during the sequence, comprising the steps of: (a) assigning a first set of identification numbers to the products, a second set of identification numbers to the groups, and a third set of identification numbers to the carriers; and (b) tracking the movement of products through the sequence using the second set of identification numbers, tracking the movement of carriers using the third set of identification numbers, and synchronizing the movement of the products and the carriers.

BRIEF DESCRIPTION OF THE DRAWINGS

FIG. 4 is a flow chart depicting the process for responding to a request to add an identification tag for a cassette to the database.

FIG. 5 illustrates the thread of execution for a request to retrieve a lot from a material control system, or "MCS," stocker.

DETAILED DESCRIPTION OF THE PREFERRED EMBODIMENT

I. FIGS. 1–5

Figure 1:
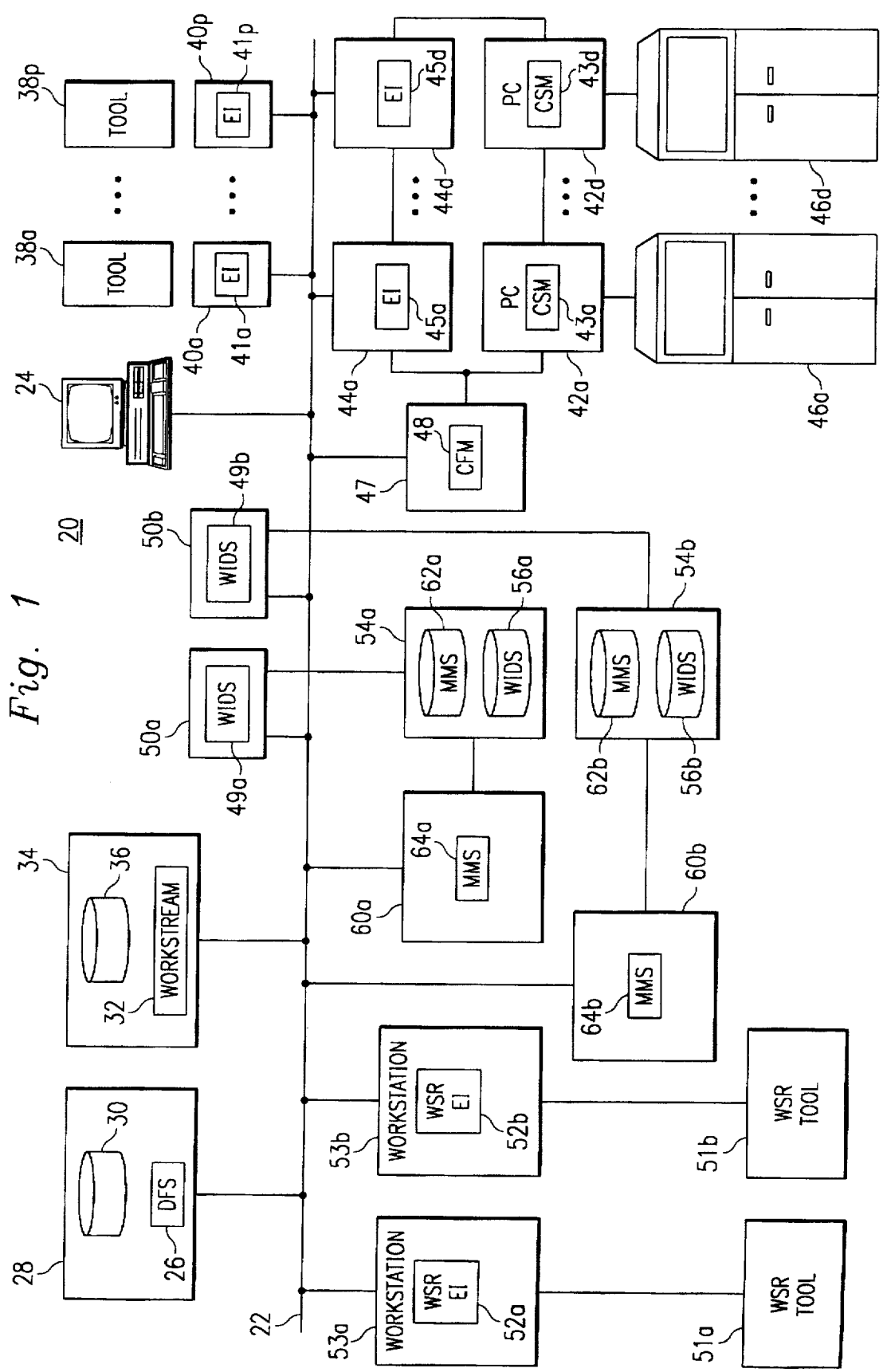
FIG. 1 is a schematic diagram depicting the architecture of a control system for the fabrication of integrated circuits.

Referring to FIG. 1 of the drawings, the reference numeral 20 refers, in general, to a control system for the fabrication of integrated circuits on semiconductor wafers. The control system 20 has a central bus 22 to which the various control elements connect. The language, or "protocol" used on the bus 22 is called "ISIS", and is sold by ISIS Distributed Systems. A personal computer 24 connects to the bus 22 for ad hoc access to all movement functions for the cassettes and wafers.

A distributed factory system ("DFS") computer program 26 sold by Consilium, Inc. is resident on a UNIX workstation 28. The UNIX workstation 28 connects to the bus 22 for controlling, by use of the DFS 26, the manufacturing process of the wafers. The DFS 26 does this by tracking the handling of wafers by logical lots. A database 30 for use by the DFS 26, for supplying the needed information to the DFS 26, is also resident on the workstation 28. The database 30 is also supplied by Consilium, Inc. with the DFS 26.

The DFS 26 is the newest version of Consilium's older computer program 32, called "WorkStream Open" or just "WorkStream". The program 32 is resident on a UNIX workstation 34, which is also used to control the manufacturing process of the wafers. A database 36 for use by the WorkStream program 32, for supplying the needed information to the WorkStream program 32, is also resident on the workstation 34. The database 36 is supplied by Consilium, Inc. with the WorkStream program 32.

Tools 38a through 38p used in the manufacturing process of the semiconductor wafers connect to the bus 22 via Hewlett Packard work stations 40a through 40p, running equipment interface ("EI") programs 41a through 41p, respectively. The equipment interface programs 41a through 41p function as translators between the language of the tools and the ISIS language of the bus 22.

CSM personal computers 42a through 42d connect to the bus 22 via a Hewlett Packard CSM control computer 47 running CFM software 48. In the preferred embodiment, each stocker is controlled by a separate CSM computer. In an alternate embodiment, one CSM computer controls up to three stockers. The control computer 47 controls all the CSM computers 42a–42d. The personal computers 42a–42d run Sunsoft's "Interactive UNIX" as an operating system, and CSM application programs 43a through 43d, licensed by Daifuku. The personal computers 42a–42d are connected to each other via an ethernet. The control computer 47 connects to the bus 22. The CFM program 48 functions as a translator between the language of the PC 42 ethernet and the ISIS language of the bus 22.

The personal computers 42a–42d schedule movement of the cassettes in and out of material stockers, schedule movement of the cassettes on an overhead cassette monorail, and keep track of all the cassettes in each stocker, and the lot numbers assigned to each stocker. Because of these functions which they perform, the personal computers 42a–42d are called "clean stocker managers", or "CSM". Four material stockers 46a through 46d connect to the personal computers 42a–42d for storing empty cassettes, and cassettes of wafers.

The personal computers 42a–42d also connect to the bus 22 via Hewlett Packard work stations 44a through 44d, running equipment interface ("EI") programs 45a through 45d, respectively.

A. WIDS

Two wafer ID servers ("WIDS") 49a, 49b, which are computer programs resident on UNIX workstations 50a, 50b, respectively, maintain information regarding the wafers in WIDS databases 56a, 56b, respectively, resident on UNIX workstations 54a, 54b respectively. The WIDS 49a, 49b maintain in the databases 56a, 56b wafer ID's, the position of the wafers within the cassettes, and the process steps through which each wafer passes. The WIDS database 56b is a backup database to the WIDS database 56b, for providing redundancy, or "fault tolerance".

Wafer sorters ("WSR") 51a, 51b are tools which move wafers within and/or between cassettes. They also verify the identity of wafers and cassettes, sort wafers, and split and merge lots. The WSR 51a, 51b connect to the bus 22 via WSR equipment interface programs 52a, 52b, respectively, resident on Hewlett Packard workstations 53a, 53b, respectively. The WSR equipment interface programs 52a, 52b act as translators between the language of the WSR 51a, 51b and the ISIS language of the bus 22.

B. Material Movement Server ("MMS")

Two workstations 60a, 60b connect to the bus 22 and to the workstations 54a, 54b, for access to MMS databases 62a, 62b. The two MMS databases 62a, 62b contain the original cassette IDs, the colors of the cassettes, cassette tags, lots-to-tags mapping, and configuration information regarding the stockers 46. The two MMS databases 62a, 62b are also used to validate the cassette IDs. In an alternate embodiment, the two MMS databases 62a, 62b are extensions of the Workstream database 36.

The workstations 60a, 60b have resident on them the program of the present invention, the material movement server ("MMS") 64a, 64b. The two MMS programs 64a, 64b mesh the two WIDS 49a, 49b and the two MMS databases 62a, 62b with the DFS program 26 and with the WorkStream program 32, using the ISIS bus protocol. The MMS programs 64a, 64b allow a requester to retrieve a cassette tag, or "ID" for a given lot ID, or retrieve a lot ID for a given cassette ID.

The MMS programs 64a, 64b provide facilities for accessing lot and carrier data for shop floor control, provide protocols to external entities to facilitate movement of the wafers on the shop floor, provide user interfaces for ad-hoc use by operators, and are sensitive to time-out values when interacting with the equipment interfaces 45a through 45d.

The MMS programs 64a, 64b provide a method for tracking products (the wafers) within a sequence of processes, in which the products are moved in carriers (the cassettes) through the sequence, and the products are initially arranged in groups (lots), and wherein the products are moved between different carriers during the sequence. The method of the present invention includes the steps of (a) assigning a first set of identification numbers to the products (wafer IDs), a second set of identification numbers to the groups (lot IDs), and a third set of identification numbers to the carriers (tags); and (b) tracking the movements of products through the sequence using the lot ID's, tracking the movement of carriers using the tags, and synchronizing the movements of the products and the carriers.

Figure 2:
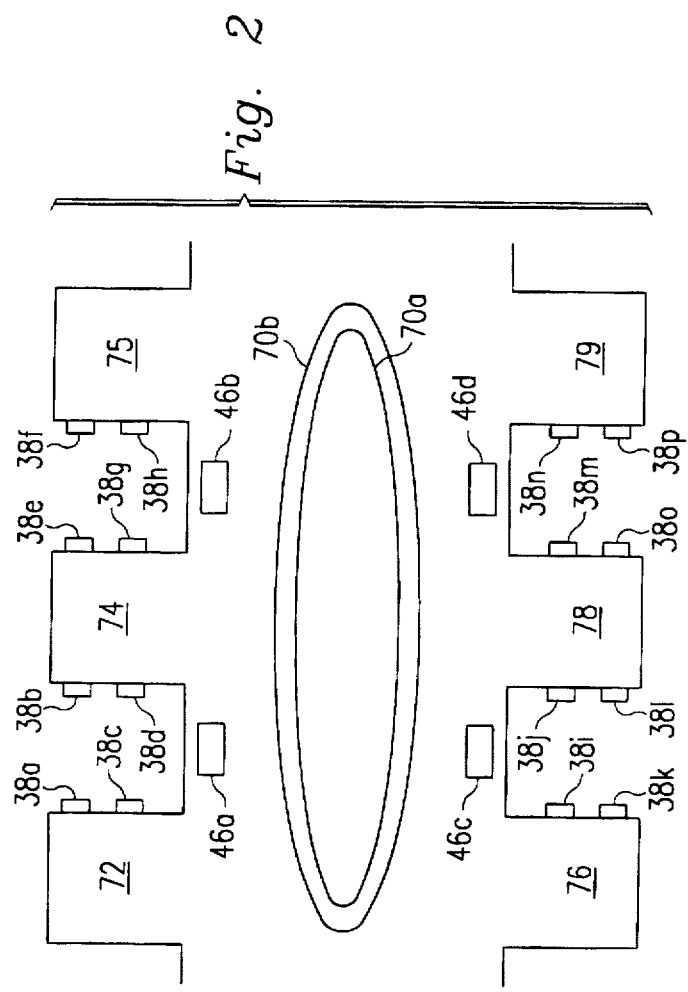
FIG. 2 is a schematic diagram showing the physical layout of the shop floor.

Referring to FIG. 2, monorails 70a, 70b carry the cassettes to and from the stockers 46. The tools 38a–38p are located at bays 72, 74, 75, 76, 78, and 79.

Figure 3:
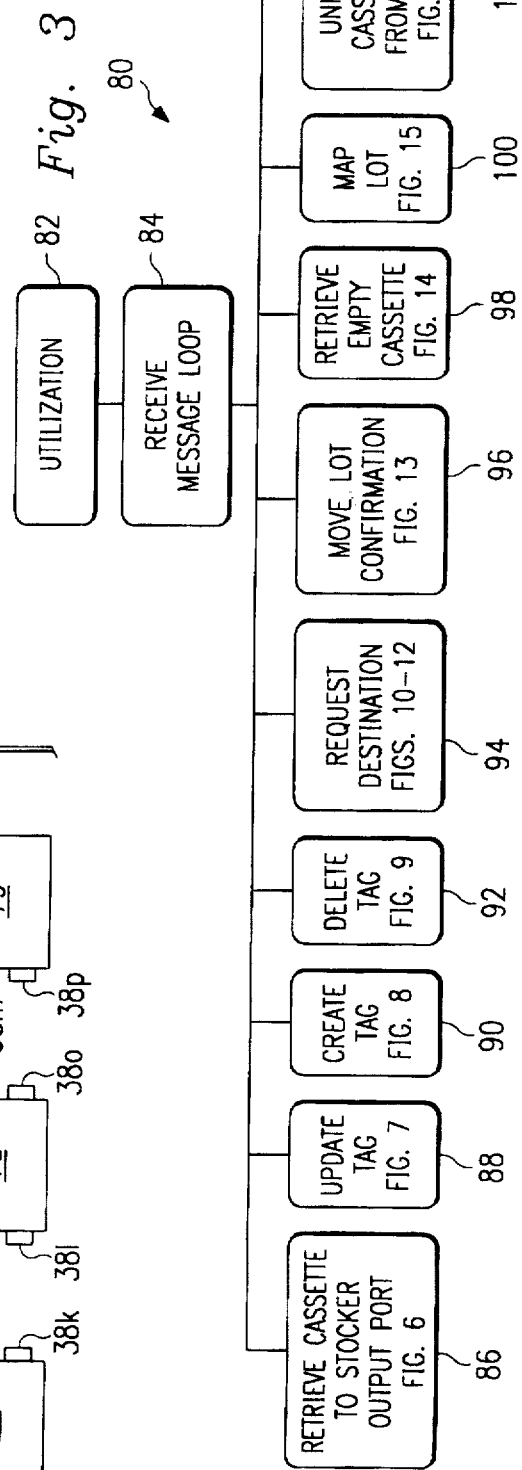
FIG. 3 is a flow chart depicting the main driver loop of the program of the present invention.
Figure 6:
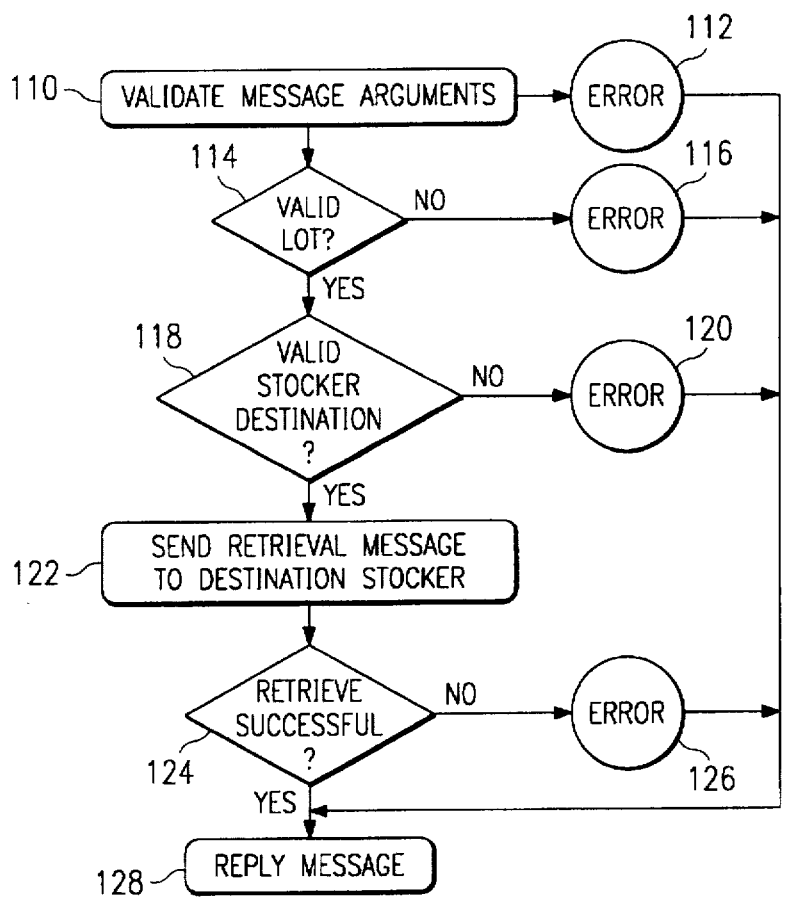
FIG. 6 is a flow chart depicting the software module for retrieving empty cassettes.
Figure 7:
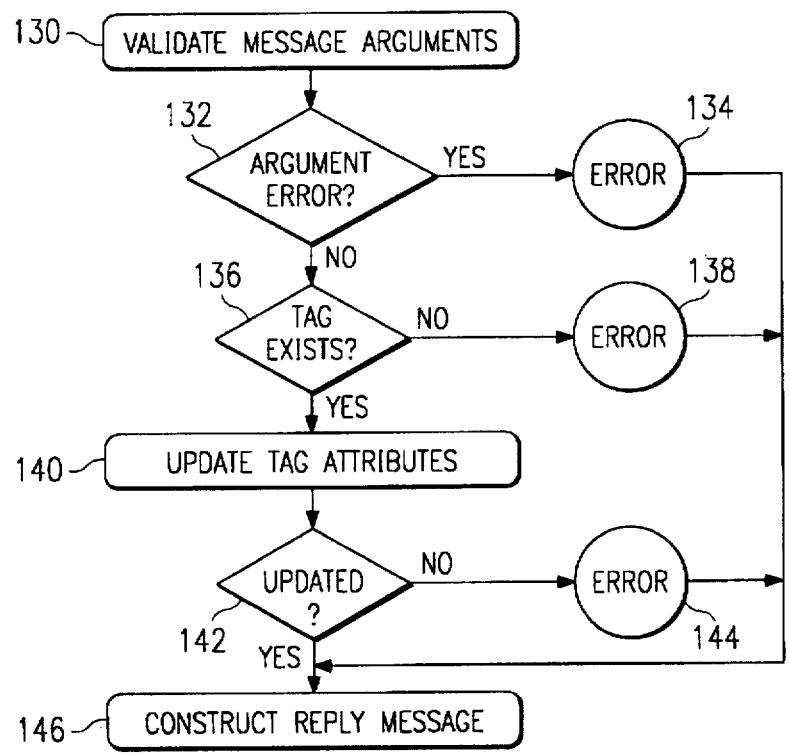
FIG. 7 is a flow chart depicting the software module for updating a tag.
Figure 8:
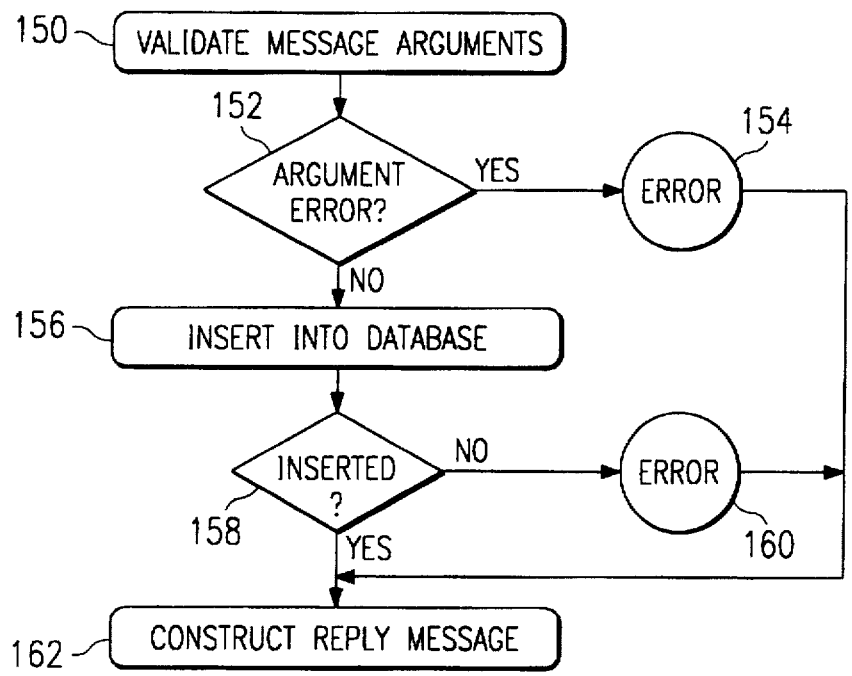
FIG. 8 is a flow chart depicting the software module for creating a tag.
Figure 9:
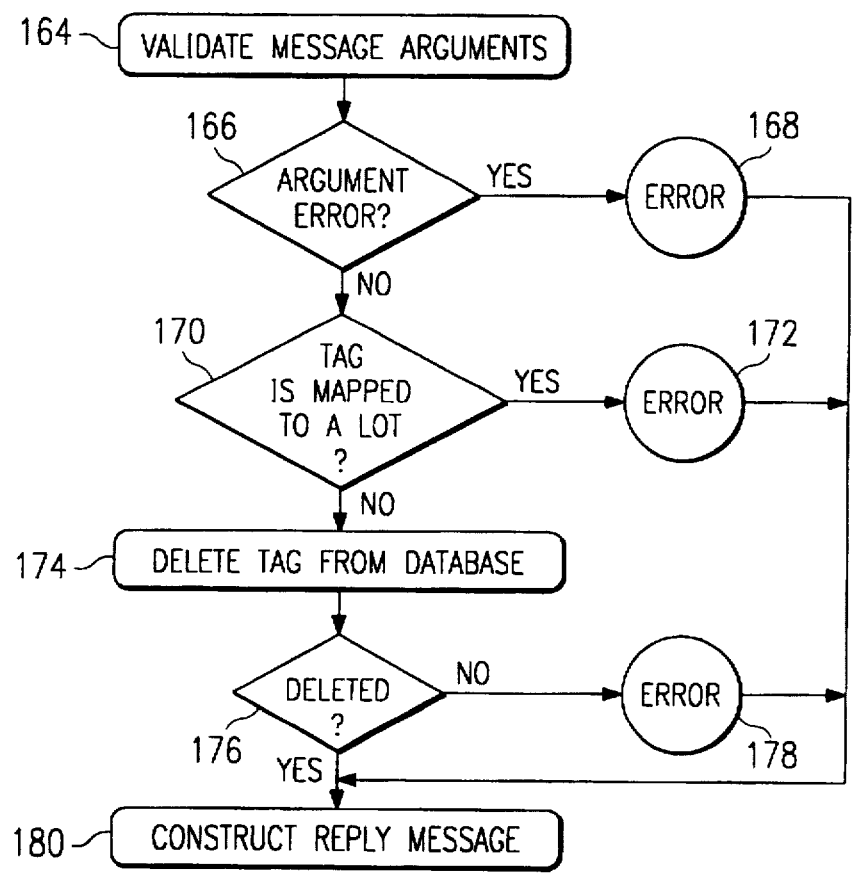
FIG. 9 is a flow chart depicting the software module for deleting a tag.
Figure 10:
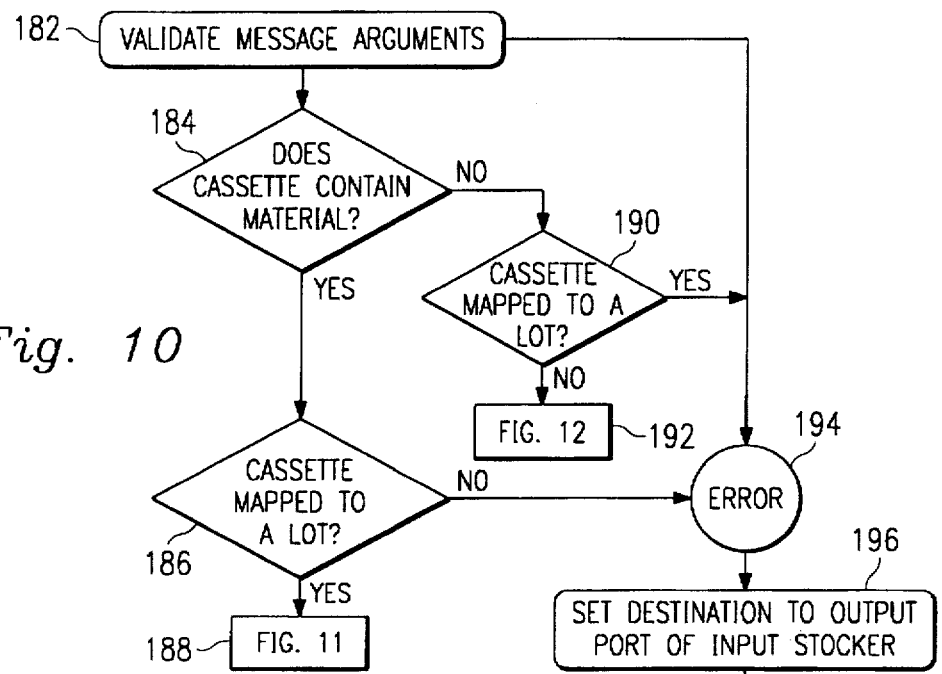
FIG. 10 is a flow chart depicting the software module for requesting a destination for a cassette.
Figure 11:
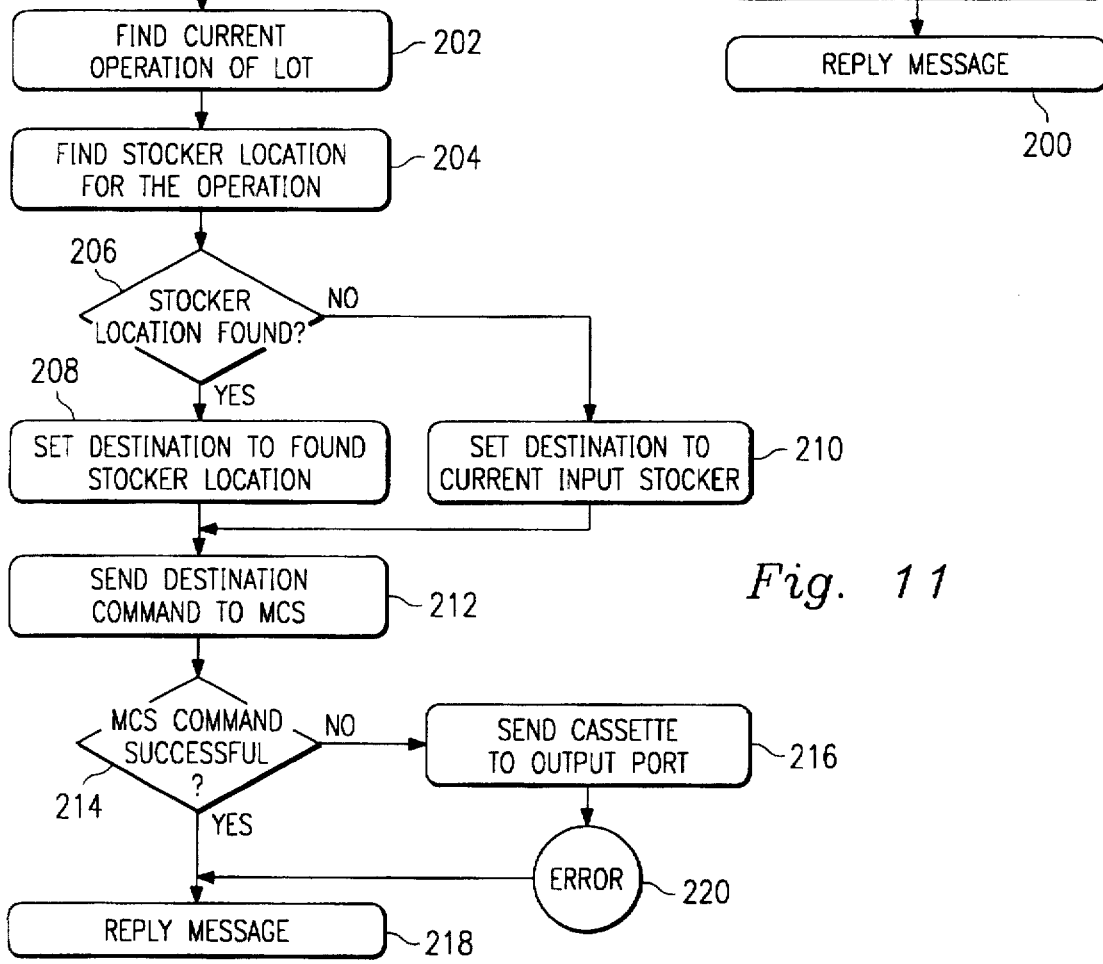
FIG. 11 is a flow chart depicting the software module for sending a cassette ahead to the next stocker in the fabrication process, and is a continuation of FIG. 10.
Figure 12:
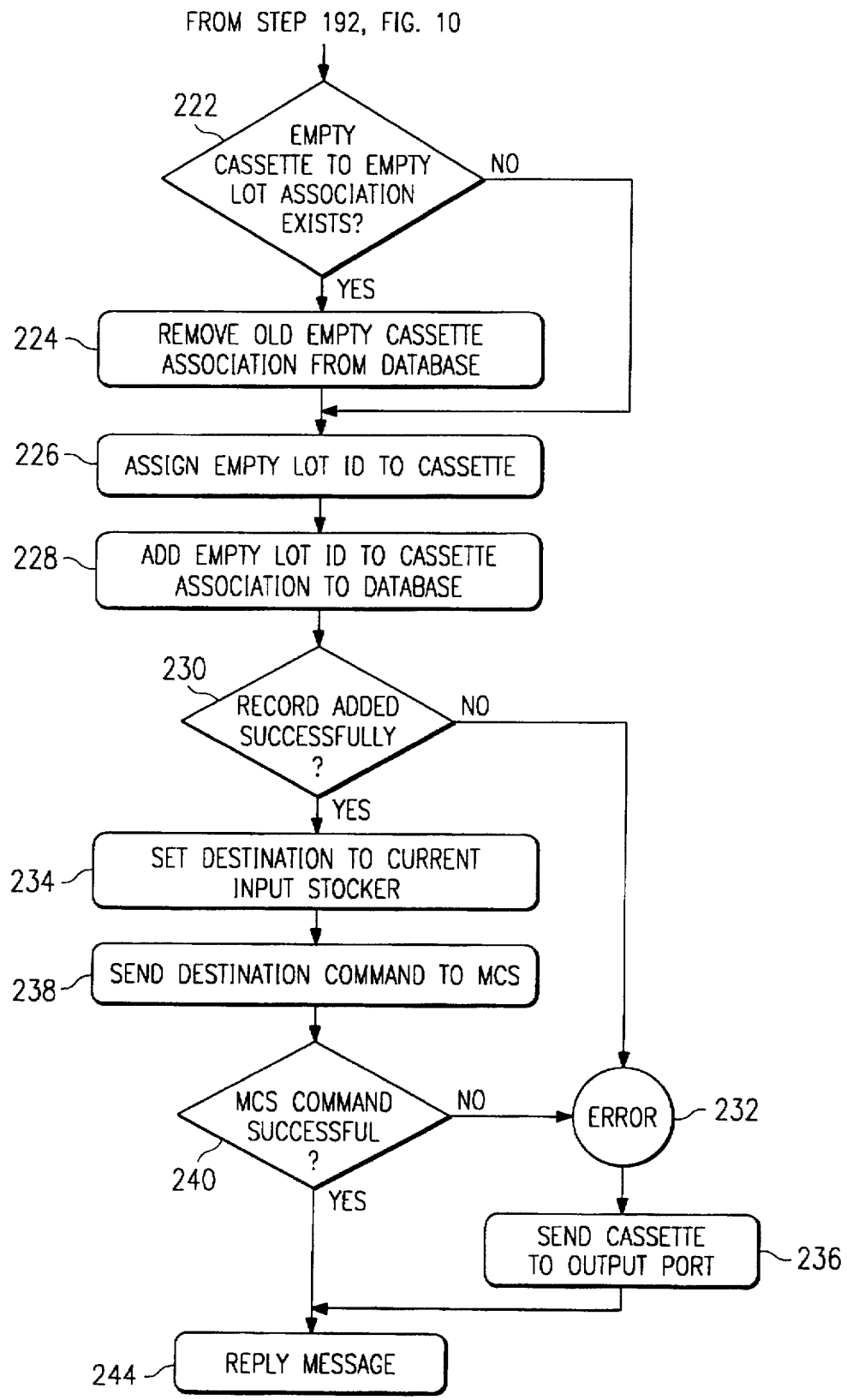
FIG. 12 is a flow chart depicting the software module for processing an empty cassette, and is a continuation of FIG. 10.
Figure 13:
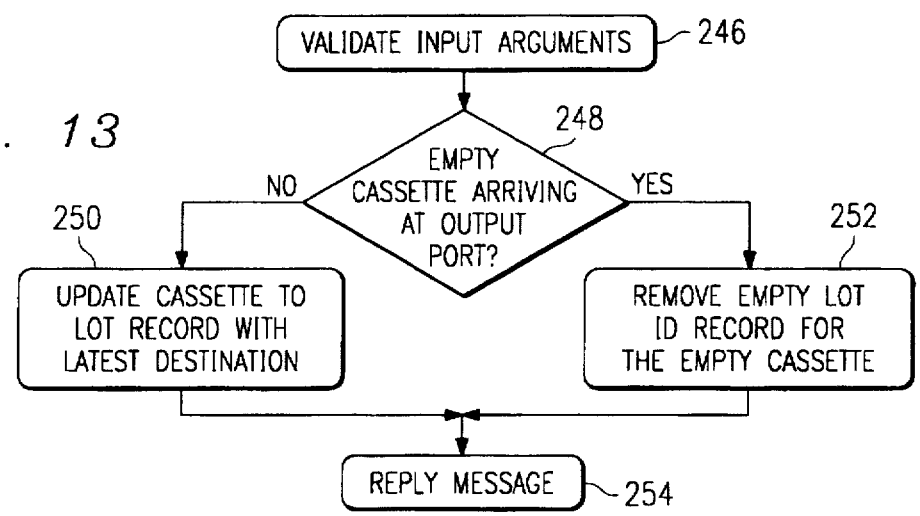
FIG. 13 is a flow chart depicting the software module for confirming the movement of a lot.
Figure 14:
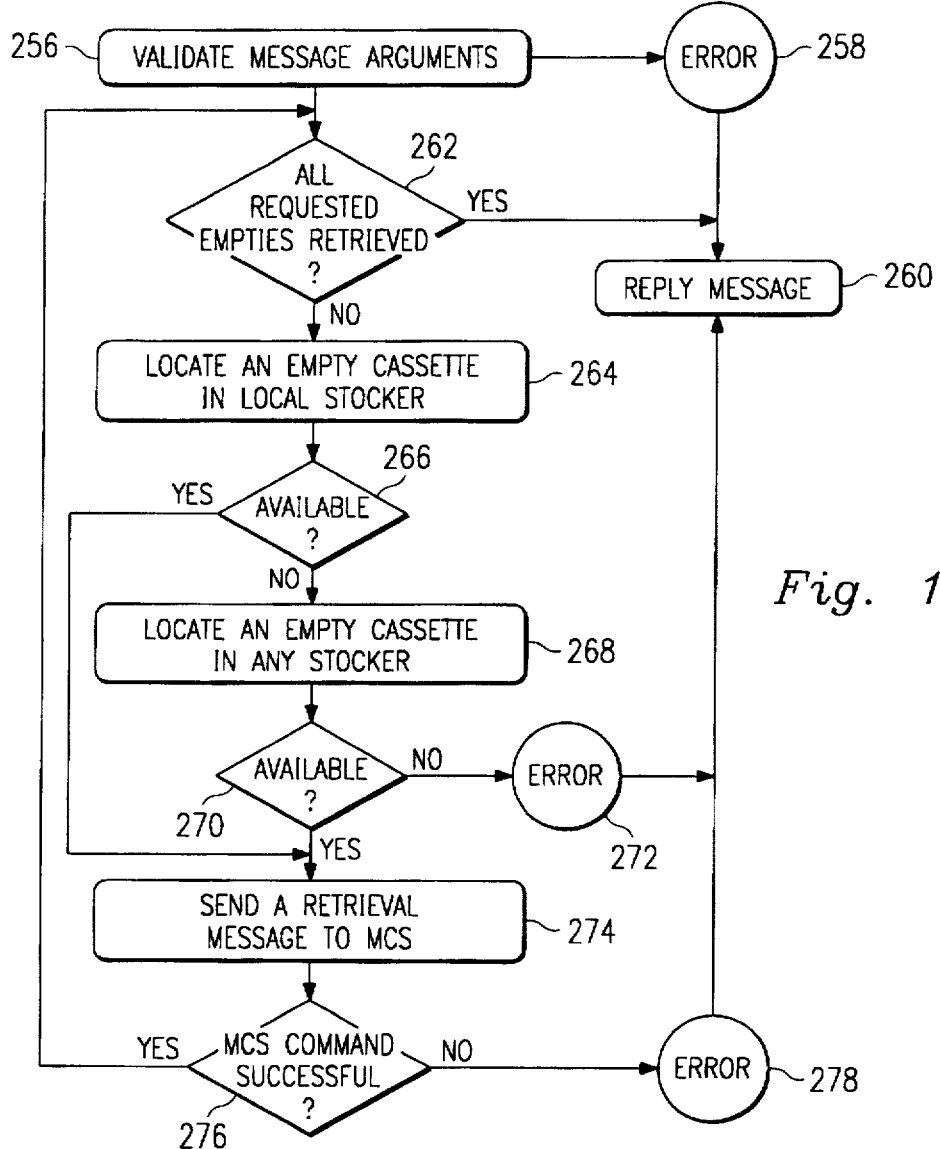
FIG. 14 is a flow chart depicting the software module for retrieving a cassette to a stocker outport port.
Figure 15:
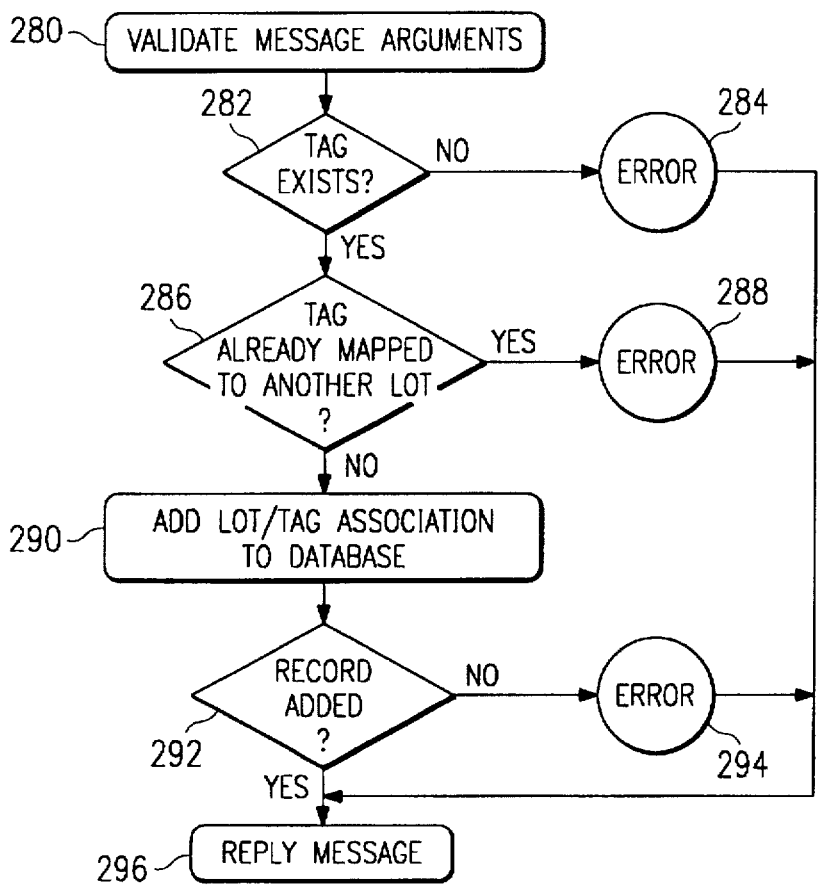
FIG. 15 is a flow chart depicting the software module for mapping a lot to a carrier.
Figure 16:
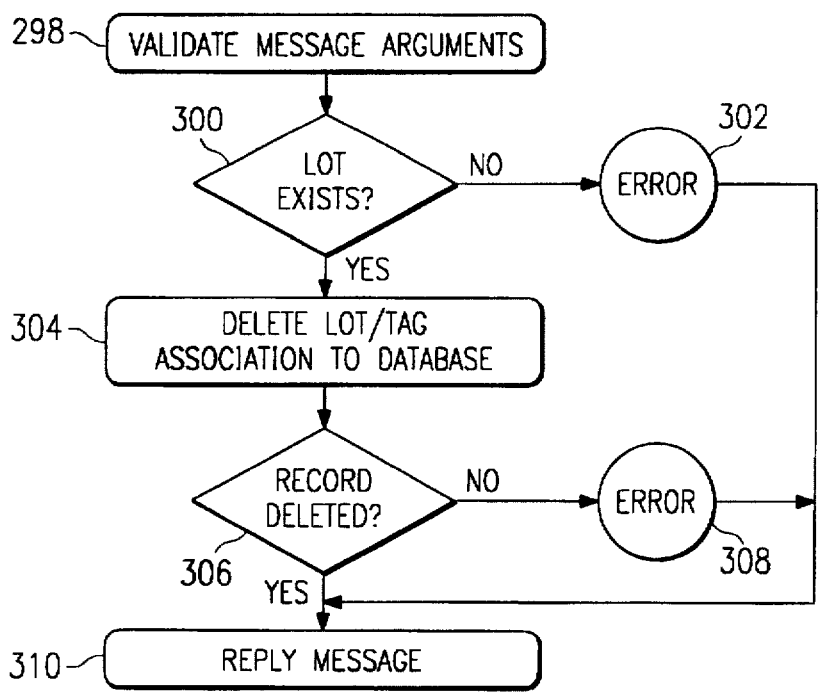
FIG. 16 is a flow chart depicting the software module for unmapping a cassette from a lot.

Referring to FIG. 3, a main driver loop 80 includes the following modules: initialization 82; receive message loop 84; retrieving empty cassettes to the stocker output port 86, depicted in FIG. 6; updating a tag 88, depicted in FIG. 7; creating a tag 90, depicted in FIG. 8; deleting a tag 92, depicted in FIG. 9; requesting a destination for a cassette 94, depicted in FIGS. 10–12; confirming the movement of a lot 96, depicted in FIG. 13; retrieving a cassette to a stocker outport port 98, depicted in FIG. 14; mapping a lot to a carrier 100, depicted in FIG. 15; and unmapping a cassette from a lot 102, depicted in FIG. 16.

II. MMS INTERNAL DESIGN

A. Generic Database Support

Referring to FIG. 4, all requests are serviced by a generic "table-driven" message processing mechanism built into the MMS. FIG. 4 identifies four areas of interest in the message process thread, respectively designated A4, B4, C4, and D4. Descriptions of the processing which occurs at each one of these steps is presented below.

Step A4—Requester Sends Message Request to MMS

Step A4 illustrates the initiation of the message request from a requester to MMS. Although this processing occurs outside the realm of MMS there are a few important points to note here. First, when a requester is sending a message to MMS, it must be done using the ISIS message bus protocol. The ISIS_PORT of the requester must coincide with the ISIS_PORT of the MMS executable. This can usually be determined by examining the environment variables which have been set for both the requester and MMS.

Second, when a requester is sending a request to MMS, the name and structure of the request must be known and agreed upon by the requester and MMS. In the example above, the request name, mmsAddTag: is followed by a string which indicates the tag ID which the requester would like to add to the database. Therefore, the requester and MMS must be aware that mmsAddTag: is a valid request name and that a sole parameter for the request is a string which indicates the tag ID to be added.

Third, MMS performs message validation on all requests presented to it. If a message is unknown to it, MMS will respond to the requester with a isisServerDidNotUnderstand: message. Additionally, if the MMS server has validated the request but the associated data elements which have been sent to MMS are in an unexpected format, MMS will respond with an Invalid Message Format return code. In either case, the request cannot be processed by MMS.

Step B4—Message Validation

When MMS receives a message on the ISIS message bus, MMS must validate the message in order to determine what action is to be taken on behalf of the requester. MMS performs this message validation using a table look-up method.

MMS implements a table called the Function_Table (partially shown in FIG. 4) which identifies all valid MMS messages. It performs this function by holding all of the names of valid MMS requests in string form. When a message is received by MMS, it initially compares the message name to each one of the valid MMS request strings in the Function_Table. If the message name is not found, the isisServerDidNotUnderstand: message is returned to the requester. A representation of this table processing is presented in FIG. 3. Function_Table is initialized in the mms_main.c module using the definitions stored in mms.h. Once the message name has been verified, MMS moves on to the next step in message processing.

Function_Table provides an additional service to MMS. Each element of the table contains a request name as a string and a corresponding function pointer. This pointer points to the function which is to be executed when the associated request name is received by MMS. In this example, the corresponding function for the mmsAddTag: request is addTag(msg, reply).

When MMS encounters a valid request in the Function_Table, it retrieves the data parameters portion of the ISIS message and sends them as a parameter to the corresponding function. A reply message is also passed to the function. This approach allows the function to perform the validation of the data elements, to process the message if all data passes validation, and to reply to the request indicating the result of the process.

Step C4—Message parameter validation

In FIG. 4, step C4 illustrates the addTag() function being invoked by the MMS Server. The code for the addTag function resides in the mms_tag.c module. The addTag() function has two responsibilities: to perform the function required to satisfy the request, and to format a reply to the requester indicating the results of the action.

Before attempting to satisfy the request, the addTag function performs parameter validation. In this example, the addTag function determines that the first parameter is a string containing a tag ID. If the parameter is not valid, the addTag function indicates this in the reply by setting a result code and message string in the reply message. The reply message was passed to it by the MMS message validation routine in step B4. If the message parameters are valid, the thread of execution moves to the next step to satisfy the request.

Step D4—Satisfying the request

In this case, a row must be added to the MMS tag table in the MMS database using the specified tag ID. The mms_db.ec code module contains a function called createTag() which performs this duty. The addTag function calls this function and checks the return code which indicates the result of the createTag() action. The addTag function packages the result code and a corresponding message string into the reply passed to it by the MMS message validation routine. The reply is then sent back to the requester indicating the success or failure of the action.

In the preferred embodiment, all MMS messages are processed asynchronously. In an alternate embodiment, all MMS messages are processed synchronously. That is, the requester must wait for the reply, and the reply is not formatted and returned until the request has been validated and processed. Therefore the requester waits for all MMS message processing to occur before it can move on to perform other tasks. The significance of this aspect of MMS message processing will become more evident in the description of FIG. 5.

B. Generic EI Messaging Support

The similarities in FIGS. 4 and 5 illustrate the generic message processing mechanism of MMS. The content of steps A, B, and C are practically the same for both examples. The differences are first, the message and therefore the table element which is found to match and second, the corresponding function which is to be performed.

The flow chart of FIG. 5 identifies five areas of interest in the message process thread using the letters A5, B5, C5, D5 and E5. Because steps A5 and B5 do not differ from FIG. 4 for this example, descriptions of these steps are not repeated. Instead, descriptions of the processing which occurs at steps C5, D5 and E5 are presented below.

Step C5—Message parameter validation

Step C5 illustrates the retrieveLot() function being invoked by the MMS Server. The code for the retrieveLot() function resides in the mms_ei.c module. This function has basically two responsibilities. First, to perform the function required to satisfy the request, and second, to format a reply to the requester indicating the results of the action.

Before attempting to satisfy the request, the retrieveLot() function performs parameter validation. In this case, the function determines that the first parameter is a string containing a tag ID and the second parameter is a string containing a stocker ID. If the parameters are not valid, the function indicates this in the reply by setting a result code and message string in the reply message. The reply message was passed to it by the MMS message validation routine in step B4. If the message parameters are valid, the function then verifies the existence of the lot and stocker by calling the appropriate validation functions lotExists() and stockerExists() in the mms_db.ec module. These functions reside in this module mms_db.ec, which provides all support for database access activity. The lot and stocker are verified by accessing the associated tables in the MMS database.

The retrieveLot() function verifies the lot and stocker parameters and then attempts to satisfy the request by calling the retrieveToStocker() function in step D4. When the retrieveToStocker() function returns its value, the retrieveLot() function stores the value in the reply with a corresponding message string and returns it to caller so that it can be returned to the requester, indicating the success or failure of the action.

Step D5—Satisfying the Retrieve Request

Now that parameter validation has been successfully accomplished, an attempt can be made to communicate with the MCS to request a move of the specified lot to a requested stocker. Because communication with the MCS occurs via the Equipment Interface using the ISIS message bus, the same ISIS communication protocol rules apply as they do for client requesters that send messages to MMS. The message protocols must be clearly defined and both the client and server must adhere to these protocols in order for the requests to be understood and acted upon reliably. In this case, however, MMS is the client to the MCS and must therefore package the parameters for the request in a predefined format before accompanying them with the message defined to take the required action.

In this example, the message is formatted by a routine in MMS and then the message is sent to the EI via the ISIS message bus using the cbcast function. Once the message has been sent, MMS waits for the reply and retrieves the return code and message string from it. These values are then formatted into the reply which is returned to the original requester.

Step E5-EI—MCS Communication

No MMS processing occurs in step E5. The ISIS_PORT parameter for both of the ISIS sessions are expected to be the same. However, this is not a requirement. Nevertheless, the EI messaging thread of execution is still completely synchronous. The original requester waits for the message reply. The reply is not formatted and returned until either the message validation fails, the request fails, or the request succeeds. There is a time-out value associated with the request that MMS makes to the EI. If the EI does not respond within a certain time period, a time-out failure response is returned to the requester.

C. MMS Initialization

Referring again to FIG. 3, the initialization step 70 includes all the initialization which MMS must perform in order to send and receive ISIS messages. The initialization includes the following ten software modules: main, cli_validate, init_mms, init_env, init_globals, init_rmct, init_nonstd, open_mms_db, mbus_init, and service_maintask.

Main()

The C source code for the MMS main() function is presented below. First, command line parameters are validated. If command line parameters are valid, MMS initialization is performed, the MMS database is opened and the ISIS message bus is initialized. If ISIS initialization is successful, main() enters the ISIS message receive loop. Here, all ISIS messages to MMS are processed. As discussed later, MMS remains in this message processing loop, until an MMS_STOP message is received. At that point, the program breaks out of the loop, the MMS database is closed and the program ends.

```
int main (argc, argv)
    int argc;
    char **argv;
{
    int cli_validate(), res;
    /* Validate the Command Line options */
    if (cli_validate(argc, argv) != 0) return(-1);
    /* initialize Material Movement Server globals */
    init_mms();
    /* Open the database */
    open_mms_db();
    /* Initialize the ISIS message bus */
    res = mbus_init();
    /* Enter the receive loop */
    if (!(res)) {
        if (!(addr_isnull (Gaddr_p))) receive_loop();
    }
    /* Close the database */
    close_mms_db();
    log_output("MMS process ended");
    return(0);
}
``` cli_validate()

The first duty of MMS is to perform verification of its command line parameters. This is performed by the cli_validate() function. The only command line parameters supported by MMS are the ISIS port number and the ISIS group name. Any other parameter entered on the command line causes MMS to end.

The specified valid port number and group name are stored in the global variable for MMS to use in its ISIS initialization phase.

```
int cli_validate(argc, argv)
    int argc;
    char **argv;
{
    while (argc-- > 1) {
        if (**++argv >= '0'&& **argv <= '9')
            Isis_Portno = atoi (*argv);
        else if (**argv == '-')
            switch ((*argv)[1])
            {
                case 'p':C
                    Isis_Portno = atoi (&((*argv)[2]));
                    break;
                case 'g':
                    strcpy(Group_Name, (&((*argv)[2])));
                    break;
                default:
                    panic ("%s%s: invalid option %c\n",
                        Err_Prefix, argv[0],(*argv)[1]);
            }
    }
    return(0);
}
``` init_mms()

After command line parameters have been validated, the MMS Server begins initialization of the global variables. The code for the init_mms() function is presented below.

```
init_mms()
{
Proc_id = getpid();
init_env();
init_globals();
init_rmct();
init_nonstd();
}
```

First the process ID for the executing program is retained. Then global variables are set from environment variables which have been set prior to the loading of MMS. The init_env() function handles this task.
init_env()
The three variable init_env() sets, Logging_mms, Tracing_mms, and Publish are for logging, tracing and publishing respectively, as shown in the code below. Once the tracing and logging values are set, MMS can determine what level of debugging messages will be output to the MMS activity log. The Publish value determines whether or not MMS will publish information to interested ISIS subscribers about lots reaching a final destination in a stocker.

```
init_env()
{
int   stat;
char  *envstr;
strcpy(Publish, NO_STRING);
envstr = getenv(MMS_ENV_PUBLISH);
if (envstr != NULL) strncpy(Publish, envstr, 1);
Logging_mms = MMS_STATUS_UP;
envstr = getenv(MMS_ENV_LOG);
if (envstr != NULL)
   stat = atoi(envstr);
   if ((stat == 0) || (stat == 1)) {
      Logging_mms = stat;
   }
}
Tracing_mms = MMS_STATUS_UP;
envstr = getenv(MMS_ENV_TRACE);
if (envstr != NULL) {
   stat = atoi(envstr);
   if ((stat == 0) || (stat == 1)) {
      Tracing_mms = stat;
   }
}
}
``` init_globals()
After the environment variable settings have been determined, MMS begins initializing the global variable array, Function_Table. This array contains a set of associations of message names and corresponding function pointers. A code snippet from this routine is presented below.

```
init_globals()
{
int stop_mms();
strcpy(Function_Table[MMS_IDX_STOP].selector, MMS_STOP);
Function_Table[MMS_IDX_STOP].func = stop_mms;
}
```

The Function_Table global variable is allocated at compile time for the maximum number of entries required to fill the table with all valid messages. This is performed by the following line of code.
   MMS_FUNCTION_ENTRY Function_Table[MMS_MAX_FUNCTIONS];
The MMS_FUNCTION_ENTRY structure includes a character string and a function pointer. This definition resides in the mms.h header file as shown below. The maximum size of any MMS message is 49 bytes.

```
typedef struct _MMS_FUNCTION_ENTRY
{
int    (*func)();   /* function pointer for entry */
char   selector[50]; /* paired ST method selector */
} MMS_FUNCTION_ENTRY;
```

The init_globals() routine uses the definitions in the mms.h header file to fill each table entry with the message selector string. In the example above the MMS_STOP string is copied to the message selector in the table entry at index MMS_IDX_STOP.
There are two bodies of definitions in mms.h, one for indices, the other for message strings. The definitions are used solely for initializing the table. In our example, MMS_IDX_STOP is defined as index 0. The first entry in the table is, therefore, defined to contain the entry which associates the message selector string MMS_STOP to its corresponding function stop_mms().

```
/* Function Table Indices */
#define MMS_IDX_STOP        0
#define MMS_IDX_LOGGING     MMS_IDX_STOP + 1
...
#define MMS_STOP            "mmsStop:"
```

This table implementation does not make any assumptions about the order of the strings or the indices. The code does not have to initialize the table in the order of the indices. But, each index must be unique and each function pointer must be valid.
The scheme for defining indices to be used for the initialization of Function_Table provides for all indices to be unique and contiguous. By defining the first index as zero and then defining subsequent indices as one greater than the last, each index will be unique and all indices will be contiguous. This scheme also provides flexibility by allowing the table to be expanded or shrunk as necessary with little code modification.
In the body of index definitions, the last #define, MMS_MAX_FUNCTIONS, is used to automatically allocate the table at compile time. This define must always retain its position as the last defining entry in order for the correct array size to be allocated.
init_rm nct()
In a similar fashion to init_globals(), the init_rmct() function initializes the RMCT_Function_Table for process automation module, or "PAM," action remote control requests. MMS stores all valid remote control requests in a separate table called RMCT_Function_Table. The indices and message strings used in the initialization of the RMCT_Function_Table are defined in the mms_pam.h header file. However, the PAM remote control messages, PSV10501, PSV10701, etc. are defined in mms.h, and are used to initialize entries in Function_Table. A remote control request must be recognized as such before appropriate action can be taken by MMS. The remote control request must therefore be defined as a valid message in Function_Table in order for it to be recognized by MMS.
The code for this function is found in the $mms_{13}$ pam.c module. When the WorkStream requester sends a PSV10501 request, it expects to receive as a reply, a message which contains all of the valid remote control message IDs and corresponding message strings. After the reply is received, the requester then determines which message is appropriate to send and sends it to MMS, specifying the required message ID.

The message PSV10501 triggers the function psv10501() to build the PSV10502 response by using the RMCT_Function_Table. Then when the PSV10701 message is recognized by MMS and the psv10701() function is called, the RMCT_Function_Table is used to determine what remote control action is to be taken.

init_nonstd()

The init_nonstd() function initializes the NONSTD_Function_Table, a global array variable whose entries define valid non-standard PAM actions which MMS can take action on. This table is very similar to the RMCT_Function_Table discussed above with a couple of exceptions.

The RMCT_Function_Table entries do not require a message string. The table could have been implemented as merely a table of function pointers since non-standard PAM actions do not require a message name, only a message ID. The second exception is that processing of both Function_Table and RMCT_Function_Table assumes that all entries in the table are valid. This is based on the index definitions for each table. Each index is unique and all indexes are contiguous. The NONSTD_Function_Table breaks this rule. The code for init_nonstd() follows below.

```
init_nonstd()
{
 int nonstd_err();
 int nonstd_retrieve_empties();
 trace_output("Initializing Non Standard PAM Action global data");
 /* valid non standard requests */
 NONSTD_Function_Table[MMS_NONSTD_IDX_UNUSED1].func = nonstd_err;
     NONSTD_Function_Table[MMS_NONSTD_IDX_RETRIEVE_EMPTIES].func =
nonstd_retrieve_empties;
}
```

As the code above indicates, the only valid non standard PAM action function is the nonstd_retrieve_empties()

function. The message ID for this function is 2. Since MMS uses a value of one less than the message ID as an index into the table, index 1 is the only valid index. Therefore, message ID 1 is invalid. An index for the first entry is therefore defined and the corresponding function returns an error to the requester which indicates that the request to MMS is invalid.

open_mms_db()

MMS initializes the INFORMIX database by performing the open_mms_db() function. The code for this function is presented below. This function is found in the mms_db.ec module.

```
open_mms_db()
{
 int rc;
 exec sql database comets;
 if (rc = error_check("open_mms_db")) exit(rc);
}
```

This routine attempts to open the WorkStream database. If the database fails to open, MMS exits.

mbus_init()

After MMS opens the INFORMIX database, the ISIS message bus is initialized in the mbus_init() routine shown below:

```
int mbus_init ()
{
 void service_maintask();
 /* Initialize and run ISIS */
 trace_output("Initializing ISIS");
 isis_logging(1);
 Run_mms = MMS_STATUS_UP;
 if (isis_remote_init((char *)0,0,0, ISIS_NOCOPYRIGHTNOTICE) == -1) return(-1);
 isis_task (service_maintask, "service_maintask");
 isis_entry (RDOM_ENTRY_DATA, MSG_ENQUEUE, "any message");
 service_maintask();
 return(0);
}
```

Isis_logging is turned on and the global variable Run_mms is set to indicate that MMS is to be up and running. The ISIS task is identified as service_maintask and the ISIS entry is RDOM_ENTRY_DATA. If isis_remote_init fails, the caller, main(), is notified and MMS exits.

service_maintask()

This routine shown below completes the ISIS message bus initialization by joining the indicated process group, Group_Name, and setting the global variable Gaddr_p which is a pointer to the joined process group. If the join fails, MMS exits after printing a message to standard output.

```
void service_maintask()
{
  void group_change();
  /* Join the process group and monitor member changes */
  trace_output("Joining process group");
  Gaddr_p = pg_join(Group_Name, PG_MONITOR, group_change,
  0, 0);
  if (addr_isnull (Gaddr_p)) }
  panic ("%sjoin failed", Err_Prefix);
  } else }
  sprintf(Log_str, "Joined group %s", Group_Name);
  trace_output(Log_str);
  isis_start_done();
  }
}
```

D. MMS ISIS Message Processing receive_loop()

MMS ISIS message processing begins with the receive_loop function which is called after all MMS initialization has completed successfully. The code for this function indicates a loop which runs while the global variable, Run_MMS, is equal to MMS_STATUS_UP. The global variable is initialized to this value and is changed only when the MMS_STOP message is received. Receipt of this message would cause the loop to be exited and the MMS executable to end.

```
receive_loop()
{
  message  *mp;
  char     group_name[20];
  int      object_id, entry;
  RD_METHOD *method;
  int      process_msg(), ignore_reply();
  do {
    trace_output("Waiting for message");
    mp = msg_rcv(RDOM_ENTRY_DATA);
    coord_cohort(mp, Gaddr_p, process_msg, ignore_reply);
  }while (Run_mms == MMS_STATUS_UP);
  return(0);
}
```

While in the loop, MMS processes messages in ISIS coordinator cohort mode. All cohorts therefore exercise the ignore_reply() function when they are notified of the message. This function does nothing but log a message that it was called. The coordinator executes the process_msg() function.

process_msg()

The process_msg() function begins message processing by setting up a reply for the message and calling the receive() function as shown in the code below. After the receive() function has performed its duty, the message reply is sent and the received message is deleted.

```
int process_msg(mp)
message *mp;
{
  char group_name[20];
  int  object_id, entry;
  RD_METHOD *method;
  /* Set up for the reply */
  method = rdom_method_create(1);
  RDSetSelector (method, "isisResult:");
  receive(mp, method, group_name, &object_d);
```

```
  send_reply(mp, method, group_name, object_id);
  trace_output("Deleting processed message");
  msg_delete (mp);
  return (0);
}
``` receive()

The receive() function retrieves the message from the ISIS message bus and performs logging and tracing duties while in the process. Once the message has been retrieved, receive() passes the message onto the parse_and_perform() function which determines which request has been received and what corresponding action must be taken.

```
receive(mp, method, group_name, object_id)
  register message *mp;
  RD_METHOD  *method;
  char  *group_name;
  int  *object_id;
{
  RD_MSG_BYTE msg[2000];
  RD_DATA  *rd_ptr;
  RD_METHOD *mptr;
  double  diff;
  time_t  start_time, end_time;
  int  msg_len;
  trace_output("Received message");
  msg_get (mp, "%s %1 %C", group_name, object_id, msg, &msg_len);
  sprintf(Log_str, "object_id = %d, group_name = %s, msg_len = %d",
    *object_id, group_name, msg_len);
  trace_output(Log_str);
  rd_ptr = rdom_msg_convert(msg_len, msg);
  if (rd_ptr == (RD_DATA*)NULL) {
    trace_output("rdom_msg_convert() returned null");
    exit(1);
  }
  if (RDIsMethod(rd_ptr,0)) {
    mptr = RDMethod(rd_ptr, 0);
    sprintf(Log_str, "Received message %s", mptr->selector);
    log_output(Log_str);
    start_time = time ((long *) 0);
    parse_and_perform(rd_ptr, method, mp, group_name, object_id);
  }
  end_time = time((long *) 0);
  diff = difftime(end_time, start_time);
  sprintf(Log_str, "Processed message %s in %3.0f seconds",
    mptr->selector, diff);
  log_output(Log_str);
  rdom_data_free(rd_ptr);
  trace_output("Processed received message");
}
```

After the message has been successfully retrieved using the msg_get() function it is converted to RDO format. The receive() function then performs initial message validation by determining whether a method selector has been sent as the first item in the message. If a method has been detected by the RDIsMethod() function, the parse_and_perform() function is called to determine which method selector was sent and what action should be taken. MMS logs the length of time it takes to perform the requested action. The granularity of this timer is in seconds. After the action has been taken, the RDO data is freed.

parse_and_perform()

The parse_and_perform() function represents the heart of the generic MMS message processing. It performs a table lookup on Function_Table using the selector passed in the message by the requester. The code for this function is presented and explained below.

```
parse_and_perform(rd_ptr, method, mp, g_name, obj_id)
RD_DATA    *rd_ptr;
RD_METHOD  *method;
register message *mp;
char       *g_name;
int        *obj_id;
{
int        idx, res = -1;
RD_ARRAY   *a_ptr;
RD_METHOD  *mptr, *method_p;
char       selector[100];
mptr = RDMethod(rd_ptr, 0);
sprintf(Log_str, "method selector = [%s],
method count = %d", mptr->selector, mptr-
>count);
trace_output(Log_str);
for (idx =0; ((idx < MMS_MAX_FUNCTIONS) &&
    (res = strcmp(Function_Table[idx].selector,
mptr >selector)) != 0); idx++);
sprintf(Log_str, "method index = %i, search result = %i", idx, res);
trace_output(Log_str);
Last_Index = idx;
if (res == 0)
    res = Function_Table[idx].func(mptr, method);
    sprintf(Log_str, "method result = %i", res);
    trace_output(Log_str);
} else {
    RDSetSelector (method, "isisServerDidNotUnderstand:");
    a_ptr = rdom_array_create(1);
    if (a_ptr == (RD_ARRAY*)NULL) {
        trace_output("rdom_array_create() returned null");
        exit(1);
    }
    method_p = rdom_method_create(1);
    strcpy(selector, mptr->selector);
    RDSetSelector(method_p, selector);
    RDSetMethod(method, 0, method_p);
}
trace_output("Message processing ending.");
return(res);
}
```

The table lookup is performed by the for loop near the top of the routine. The routine prints trace output to indicate the preparation for and the results of the search. The local variable "res" indicates the result of the search. A 0 result indicates the selector was found in Function_Table. The index of the found message string is used to specify the routine to be performed. The routine takes the action required to satisfy the request. Message parameter validation is performed by the action routine.

If the message selector could not be found, the isisServerDidNotUnderstand: method selector is formatted into the reply along with the passed selector. This notifies the requester that the MMS server cannot satisfy the request because the message selector is invalid.

After MMS has performed the valid requested action, the only action left to perform in the message processing thread is to reply to the requester with the results of the action. This is performed by the send—reply() function.
send_reply()

The send_reply routine includes tracing and logging duties. Because replies are formatted in a couple of different forms, send_reply checks the formatting of the reply and determines the result code which is to be logged.

After the log and trace text has been formatted and output, the reply message is created and sent. Then the reply is sent, the allocated reply message elements are freed and the routine returns. This essentially ends the message processing cycle and execution returns to the receive_loop function where MMS waits for the next message to be processed.

E. Logging and Tracing

MMS provides for two levels of log output. Log output provides a basic level of output which indicates the message activity which has been processed by an MMS executable. Trace output provides a much more detailed view of the thread of execution for each MMS processed message. Both log and trace output are ASCII strings which are routed to standard error. This output can be redirected to a file to retain a record of activity for an MMS executable.

Logging levels can be set both at startup and dynamically while MMS is running. MMS checks two environment variables to determine the levels of logging which are to be output. By setting the MMS_ENV_LOG environment variable to a value of 1, MMS will route log level messages to standard error. By setting the MMS_ENV_LOG variable to 0, MMS will not route the log level messages.

Similarly, setting the MMS_ENV_TRACE environment variable to 1 or 0 will signal MMS to route or not route trace level messages to standard error. If neither of these environment variables are set, both log and trace level messages will be output.

Log and trace level messages can also be set dynamically while MMS is up and running. To set or unset log output, the user sends the mmsLogging: message to the MMS executable with a parameter of 0 or 1, indicating whether log level output should be set off or on respectively. The user sends the mmsTracing: message to MMS with a parameter of 0 or 1 to specify whether trace level output should be set off or on.

Each log level message contains a prefix which identifies the message as an automated material handling system, or "AMHS." message. The process ID of the MMS executable is added to the prefix along with a date and time stamp of when the message was generated. Additional content includes what message was received and what parameter elements are contained in the received message.

Log output also includes information about an MMS reply. Log output for MMS replies include the same identifying prefix as is included in log output for received messages. In addition the reply's return value and explanatory message string is included. This messaging scheme provides the log output reader with enough information to determine what message was received and what the outcome of the requested action was within MMS.

Trace output provides information about activity as a message is processed through all MMS. This output is intended for the programmer who is maintaining, debugging or enhancing MMS.

To create additional log or trace messages, the user may format a string and pass the string as a parameter to one of the logging output routines. By passing the string to the log_output() function, the string will be output if log level output is requested. The user may pass the string to the trace_output() function to have the message appear with trace level output. Both the log_output() and trace_output() functions prefix the message with a standard formatted string which includes the MMS identifier, process ID, and date and time stamp.

III. MMS Messaging Support

MMS messaging support is provided to allow any client to communicate with MMS to perform a requested action. Requests from any client will be acted on by MMS as long as the request is a valid request and the parameters required for that request are in a valid format.

However, support has been included in MMS to provide specifically for particular PAM action requests which are initiated in the WorkStream environment. Similarly, support has been included for the MCS Equipment Interface in order to integrate MMS into some operations of the MCS.

A. WorkStream Support

MMS provides support for messages from WorkStream in the form of remote control and non-standard PAM actions. Remote control requests from WorkStream assume a protocol which must be adhered to by the MMS server. The code for the functions for WorkStream support are in the module mms_pam.c.

1. PSV10501 Request, PSV10502 Reply

The first message sent by WorkStream to MMS is the PSV10501 request. This is a request by WorkStream to have the server, MMS, return all valid remote control requests. MMS performs this duty by packaging the valid remote control commands as strings in an array and returning them in the PSV10502 reply along with a return code indicating a successful operation.

Only the action code routines are covered in this section. The action code is called from the parse_and_perform() function as detailed in the section MMS ISIS Message Processing.

```
psv10501 (m_ptr, reply)
 RD_METHOD *m_ptr;
 RD_METHOD *reply;
{
 int res = 0
 sprintf(Log_str, "%s message received", MMS_PSV10501);
 trace_output(Log_str);
 psv10501_reply(reply);
 return(0);
}
```

This routine formats and outputs a trace message and calls the reply function psv10501_reply(). The reply function has the responsibility of formatting the valid remote control commands into an array and returning them to the requester in the passed reply message container. The code for this function is presented below.

```
psv10501 reply(method)
 RD_METHOD *method;
{
 RD_ARRAY *a_ptr;
 RD_METHOD *m_ptr;
 trace_output("Formatting psv10501 reply");
 m_ptr = rdom_method_create(5);
 RDSetSelector (m_ptr, MMS_PSV10502);
 format_psv10502_parms(m_ptr);
 RDSetMethod(method, 0, m_ptr);
 return(0);
}
```

The psv10501_reply() function creates an RDO method element and sets the message selector as PSV10502. This is the message that will be returned to the requester. The parameters for the message are then formatted in the call to the format_psv10502_parms() function. After the parameters are formatted they are set to be included in the reply before the routine returns to the caller. The reply is then sent to the requester using the MMS generic message processing facility.

In order to present a complete view of the implementation for the PSV10501 request, the code for the format_psv10502_parms() function is presented with a narrative explaining the actions that are taken to format the data. The structure of the parameters which comprise the reply expected by the requester is defined as follows:

```
psv10502_msg_format
{
 int    msg_id         // the message id
 int    func_count     // the function count
 char   function[24][40] // the function strings
 int    status         // the status value
 char   stat_msg       // the status message
}
format_psv10502_parms(m_ptr)
 RD_METHOD *m_ptr;
{
 int i;
 RD_ARRAY *ary_ptr;
 sprintf(Log_str, "Formatting %s message", MMS_PSV10502);
 trace_output(Log_str);
 new_rd_array(&ary_ptr, 24);
 trace_out("Formatting remote control requests");
 for(i=0;i<MMS_MAX_RMCT_FUNCTIONS;i++) }
   sprintf(Log_str, "Adding RMCT function %s as response %I",
 RMCT_Function_Table [i].selector, i);
   trace_output(Log_str);
   RDSeString(ary_ptr,i, RMCT_Function_Table[i].selector);
 }
 RDSetInt(m_ptr, 0, 10502);
 RDSetInt(m_ptr, 1, MMS_MAX_RMCT_FUNCTIONS);
 RDSetArray(m_ptr, 2, ary_ptr);
 RDSetInt(m_ptr, 3, 0);
 RDSetString(m_ptr, 4, MMS_RMCT_BLANK6);
}
```

The format_psv10502_reply() function's responsibility is to format the parameters into the reply structure. The function does this by retrieving the message string elements of the RMCT_Function_Table array and setting them in an allocated RDO array. The array as well as other required parameters are then set in the method passed by the caller.

After the PSV10502 reply has been received by the requester, the protocol calls for the requester to send a PSV10701 message to the server.

2. PSV10701 Request, PSV10702 Reply

After WorkStream has received the PSV10502 reply indicating a successful operation, WorkStream formats the PSV10701 message and sends it to MMS. The contents of this message indicate all lots which are to be operated on. MMS receives this message and responds with a PSV10702 message indicating the message has been successfully received and processed.

The intention of the PSV10701 message sent by the WorkStream requester is to identify all lots which are to be operated on by the server when the PSV10503 request is received. MMS is not currently designed to support multiple lots in this fashion.

Therefore, the PSV01701 request is essentially ignored by MMS. The message is received and replied to as if a successful operation has been performed on the contents of the PSV10701. However, MMS does not perform any operation on the contents of the request. It supports this message only to allow for the subsequent PSV10503 request to be sent and acted upon. Despite the minimal action MMS takes on the PSV10701 request, the code for MMS action routine is presented below.

```
psv10701(m_ptr, reply)
 RD_METHOD *m_ptr;
 RD_METHOD *reply;{
 sprintf(Log_str, "%s message received", MMS_PSV10701);
 trace_output(Log_dir);
```

```
psv10701_reply(reply);
return(0);
}
```

As indicated above, the psv10701() function performs no other activity other than calling the reply function psv10701_reply() to respond to the request.

```
psv10701_reply(method)
RD_METHOD *method;
{
  RD_ARRAY *a_ptr;
  RD_METHOD *m_ptr;
  trace_output("Formatting psv10701 reply");
  m_ptr = rdom_method_create(3);
  RDSetSelector(m_ptr, MMS_PSV10702);
  RDSetInt(m_ptr, 1, 0);
  RDSetString(m_ptr, 2, MMS_RMCT_BLANK6);
  RDSetMethod(method, 0, m_ptr);
  return(0);
}
```

The psv10701_reply() function formats the PSV10702 reply which is to be sent to the requester in the method parameter passed to it. A return code indicating a successful operation is included in the message. When the requester has received this message, it should send a PSV10503 message requesting a valid remote control action be taken.

3. PSV10503 Request, PSV10504 Reply

Finally, WorkStream sends the PSV10503 message containing the remote control request ID corresponding to the index of the valid remote control commands in the array returned by MMS in the PSV10502 response. MMS accepts this request, determines the operation which needs to be performed, and responds with a PSV10504 message indicating whether the operation was successful or not.

One of the major responsibilities which the psv10503() function has is message parameter validation. If all parameters are valid the request can be acted upon by the message reply routine. The contents of the request parameters are a function number integer (10503), a structure called PAMPARMS, and the option number, or the index into the array of valid remote control commands which are supported by the MMS server. This array was included in the reply to the PSV10501 request.

These three elements as well as the elements of the PAMPARMS structure which are used by the PSV10503 request are verified by the psv10503() function. First, a description of the first 10 elements of the PAMPARMS structure is documented below.

```
psv010503_msg_format
{
  Char   company_name[20]
  char   facility[6]
  char   user[12]
  char   user_class[12]
  char   lot_no[11]
  char   operation[4]
  char   event[12]
  char   entity[12]
  char   device_id[12]
  char   aux_data1[12]
  char   aux_data2[12]
  char   aux_data3[12]
```
```
  char   aux_data4[12]
  .
  .
  .
}
```

The psv10503() function verifies all parameters passed to it in the request. All parameters are packaged in an array. The first element of the array is the request ID (10502) as an integer. The second element is the PAMPARMS structure packaged as an array. The psv10503() function verifies that it is an array and that the first 11 elements of it are strings. The option ID is also validated first that it is an integer and that is within the range of valid indices. If it is valid the option ID is used to determine which action is to be performed.

Note that the option ID passed by the requester is 1 based whereas the index into the RMCT_Function_Table array is 0 based. MMS therefore subtracts 1 from the passed option ID to perform the requested action.

```
psv10503(m_ptr, reply)
RD_METHOD *m_ptr;
RD_METHOD *reply;
}
int       opt_id, res = 0;
RD_ARRAY       *rd_ptr, *a_ptr;
sprintf(Log_str, "%s message received", MMS_PSV10503);
trace_output(Log_str);
if (RDIsArray(m_ptr, 0)) {
  rd_ptr = RDArray(m_ptr, 0);
    sprintf(Log_str, "%i function number received",
    MMS_PSV10503,
RDInt(rd_ptr,0));
  trace_output(Log_str);
  if (RDIsArray(rd_ptr,1)) {
    a_ptr = RDArray(rd_ptr, 1);
    sprintf(Log_str, "%s PAMPARMS received", MMS_PSV10502);
    trace_output(Log_str);
    if (RDIsInt(rd_ptr,2) && RDIsString(a_ptr,0) &&
    RDIsString(a_ptr,1) &&
      RDIsString(a_ptr, 2) && RDIsString(a_ptr,3) &&
      RDIsString(a_ptr, 4) &&
      RDIsString(a_ptr,8) && RDIsString(a_ptr,9) &&
      RDIsString(a_ptr,10)) {
        trace_output("PAMPARMS Verified");
        opt_id = RDInt(rd_ptr,2);
        if (opt_id > MMS_MAX_RMCT_FUNCTIONS) res =
MMS_INVALID_REQUEST;
        if(res==0)res=RMCT_Function_Table[opt_id - 2].func(a_ptr);
      } else {
        res = MMS_INVALID_MSG_FORMAT;
      }
  }
  else {
    res = MMS_INVALID_MSG_FORMAT;
  }
  psv10503_reply(res, reply);
return(0);
}
```

Once the action has been performed, the result code is retained and passed to the psv10503_reply() function to format the reply. The reply function sets the string reply portion of the message based on the value of the result from the action routine which has been passed to it as res.

```
psv10503_reply(res, method)
int   res;
RD_METHOD *method;
```

```
-continued

{
  RD_ARRAY *a_ptr;
  RD_METHOD *m_ptr;
  sprintf(Log_str, "Formatting %s reply", MMS_PSV10503);
  trace_output(Log_str);
  new_rd_array(&a_ptr, 3);
  m_ptr = rdom_method_create(3);
  RDSetSelector (m_ptr, MMS_PSV10504);
  RDSetInt(m_ptr, 0, 10504);
  RDSetInt(m_ptr, 1, res);
  if(res==MMS_INVALID_TAG_ID) {
    RDSetString(m_ptr, 2, MMS_RMCT_MMS101);
  } else {
    if(res==MMS_CARRIER_EXISTS_FOR_LOT) {
      RDSetString(m_ptr, 2, MMS_RMCT_MMS102);
    } else {
      if(res==MMS_INVALID_LOT_ID) }
        RDSetString(m_ptr, 2, MMS_RMCT_MMS103);
      } else {
        if(res !=MMS_SUCCESSFUL) {
          RDSetString(m_ptr, 2, MMS_RMCT_MMS099);
        } else {
          RDSetString(m_ptr, 2, MMS_RMCT_BLANK6);
        }
      }
    }
  }
  RDSetMethod(method, 0, m_ptr);
  return(0);
}
```

When the PSV10504 reply is received by the requester, the standard PAM action remote control message thread is completed.

MMS supports WorkStream non-standard PAM actions by accepting the PSV19603 request as a valid request. Although there is only one action which is currently supported, the messaging mechanism is in place to support any number of non-standard PAM actions in the future.

The mechanism to implement the proctcol is simpler than the standard remote control PAM action mechanism detailed above. Instead of having to support three messages in the remote control protocol, only a single request and reply, PSV19603 and PSV19604, need to be supported. This protocol is simpler because there are some assumptions that are made by both the requesting client and the server.

The first assumption is made by the requester. That assumption is that the option ID, which designates what action is being requested, is a valid option ID and corresponds to the correct action on the server. For this reason, it is important for the designer of the non-standard PAM action to assure that the requester and server are synchronized in their support for the protocol.

The second assumption is one that the server makes. The server simply assumes that any option ID which is not known to it is invalid and will respond in kind to the requester. This assumption again points to the designer of the non-standard PAM action who must assure that both the client requester and the server understand the same set of messages and corresponding actions.

4. PSV19603 Request, PSV19604 Reply

The major difference between the non-standard PAM actions and the standard remote control PAM actions lies in the response. The MMS server must respond to the PSV19603 request with a buffer which represents a 24×80 formatted screen of information indicating the results of the requested action.

The action routine which is executed when the PSV19603 request is received is listed below with a subsequent narrative.

```
psv19603(m_ptr, reply)
  RD_METHOD *m_ptr;
  RD_METHOD *reply;
{
  int     opt_id, res = 0;
  RD_ARRAY *rd_ptr, *a_ptr;
  char    scrn[(MMS_MAX_NONSTD_LINES *
              MMS_MAX_NONSTD_CHARS) + 1 ;
  sprintf(Log_str, "%s message received", MMS_PSV19603);
  trace_trace_output(Log_str);
  if(RDIsArray(m_ptr, 0)) {
    a_ptr = RDArray(rd_ptr, 1);
    sprintf(Log_str, "%s PAMPARMS received", MMS_PSV19603);
    if(RDIsInt(rd_ptr,2) && RDIsString(a_ptr, 0) &&
       RDIsString(a_ptr, 1) &&
       RDIsString(a_ptr, 2) && RDIsString(a_ptr, 3) &&
       RDIsString(a_ptr, 4) &&
       RDIsString(a_ptr, 5) && RDIsString(a_ptr, 6) &&
       RDIsString(a_ptr, 7) &&
       RDIsString(a_ptr, 8) && RDIsString(a_ptr, 9) &&
       RDIsString(a_ptr, 10) &&
       RDIsString(a_ptr, 11) && RDIsString(a_ptr, 12) &&
       RDIsString(a_ptr, 13)) {
      opt_id = atoi(RDString(a_ptr,12));
      if((opt_id > MMS_MAX_NONSTD_FUNCTIONS) ||
         (opt_id < 1)) res =
             MMS_INVALID_NONSTD_REQUEST;
      sprintf(Log_str, "Function %i requested", opt_id);
      trace_output(Log_str);
      if(res == 0) res =
         NONSTD_Function_Table[opt_id -
         1].func(a_ptr, scrn);
    } else {
      res = MMS_INVALID_MSG_FORMAT;
    }
  } else {
    res = MMS_INVALID_MSG_FORMAT;
  }
  } else {
    res = MMS_INVALID_MSG_FORMAT;
  }
  psv19603_reply(reply, scrn);
  return(0);
}
```

As in the psv10503() function, the major portion of code is built to perform message parameter validation. The structure of the message is the same as the format for the PSV10503 request except that a few additional PAM-PARMS elements are verified.

Note that the option ID, which indicates the index of the action to be performed, is embedded in the PAMPARMS structure. The option ID is 1 based and the MMS index is 0 based just as it is in support for the remote control PAM actions. Once the requested action has been taken, the psv19603_reply() function is called to format the response to the requester.

The buffer which holds the representation of a 24×80 screen is passed to the action routine. The routine then has the responsibility of formatting the buffer as necessary to indicate the results of the action.

The reply function psv19603_reply() is passed to the buffer to set as a parameter in the message reply, as shown below.

```
psv19603_reply(method, scrn)
  RD_METHOD  *method;
  char       *scrn;
```

-continued

```
{
   int   it;
   RD_ARRAY  *a_ptr;
   RD_METHOD *m_ptr;
   char   str[100];
   sprintf(Log_str, "Formatting %s reply", MMS_PSV19603);
   trace_output(Log_str);
   for (i=0;i<100;++) str[i] = 0x00;
   m_ptr = rdom_method_create(5);
   new_rd_array(&a_ptr, MMS_MAX_NONSTD_LINES);
   RDSetSelector (m_ptr, MMS_PSV19604);
   RDSetInt(m_ptr, 0, 19604);   /* function */
   RDSetInt(m_ptr, 1, 1);   /* screen count */
   RDSetInt(m_ptr, 2, 0);
   RDSetString(m_ptr, 3, MMS_RMCT_BLANK6);
   for (i = 0; i < MMS_MAX_NONSTD_LINES; i++) {
       strncpy(str, &scrn[MMS_MAX_NONSTD_CHARS * i],
   MMS_MAX_NONSTD_CHARS);
       RDSetString(a_ptr, i, str);
   }
   RDSetArray(m_ptr, 4, a_ptr);
   RDSetMethod(method, 0, m_ptr);
   return(0);
}
```

Once the PSV19604 message is received by the requester, the non standard PAM action message thread is completed.

B. Equipment Interface Support

The mmsRetrieveToStocker message thread is presented as an initial example. A higher level view of this message thread was presented earlier.

1. mmsRetrieveToStocker

This message thread does not originate from an EI. Instead, the mmsRetrieveToStocker message triggers a request which is sent to an EI from MMS. Although this support for lot retrieval is included in MMS, the current WorkStream host does not send this request to MMS. In the production environment, the WorkStream client sends its request directly to the EI. Nevertheless, the support for this function will be covered to introduce the MMS server handling of communication with an EI. Later, two supported functions, mmsRequestDestination and mmsRetrieveEmpties, will be covered in detail.

When the mmsRetrieveToStocker message is received by MMS, the mmsRetrieveToStocker() function is called by the parse_and_perform() function in order to perform the requested action. The code for the mmsRetrieveToStocker() function is listed below. The code for this function resides in the mms_ei.c module.

```
retrieve_to_stocker(m_ptr, reply)
   RD_METHOD *m_ptr;
   RD_METHOD *reply;
{
   MMS_LOT   theLot;
   MMS_STOCKER aStocker;
   char   thePort[30];
   int   res;
   address  *gaddr_p;
   RD_ARRAY  *rd_ptr;
   char   destStocker[20];
   char   currentStocker[20];
   if(RDIsString(m_ptr, 0) && RDIsArray(m_ptr, 1)) {
       strcpy(theLot.lot_id, RDString(m_ptr, 0));
       rd_ptr = RDArray(m_ptr,1);
       strcpy(destStocker, RDString(rd_ptr,0));
       strcpy(thePort, RDString(rd_ptr, 1));
       sprintf(Log_str, "Retrieve lot %s to port %s", theLot.lot_id, thePort);
       log_output(Log_str);
       if ((res = get_lot(&theLot)) = 0) {
           strcpy(currentStocker, theLot.stocker_id);
           strcpy(aStocker.name, destStocker);
           if ((res = get_stocker(&aStocker)) == 0) {
               strtok(destStocker, ".");
               strcpy(theLot.stocker_id,destStocker);
               if (strlen(thePort) > 0) {
                   strcat(theLot.stocker_id, "-OUT");
                   strcat(theLot.stocker_id, thePort);
               }
               strtok(aStocker.cei, ".");
               strcat(aStocker.cei, MCS_GROUP_NAME_APPEND);
               if (!addr_isnull(gaddr_p = pg_lookup(aStocker.cei))) {
                   res = send_retrieve_lot_msg(gaddr_p, aStocker.cei, &theLot);
               } else {
                   res = MMS_MCS_NOT_FOUND;
                   sprintf(Log_str, "pg_lookup error %i", (int) gaddr_p);
                   trace_output(Log_str);
                   sprintf(Log_str, "MCS process group %s not found", aStocker.cei);
                   trace_output(Log_str);
               }
           }
       } else {
           res = MMS_INVALID_MSG_FORMAT;
       }
       retrieve_to_stocker_reply(&theLot, res, reply);
       return(res);
}
```

As explained in a previous section, the responsibilities of the mmsRetrieveToStocker() function are to perform message parameter validation, determine the EI for the destination stocker and send the mmsRetrieveLot message to the EI. Code is also included to output log and trace information as the function progresses.

Message parameter validation is performed by the RDIsString() and RDIsArray() functions. The structure of the parameters is expected to include an initial string which contains the lot ID. The lot ID is followed by an array which contains two strings. The first string element of the array is a stocker ID and the second string element is the output port.

After these elements have been validated, the strings are extracted from the message using the RDArray() and RDString() functions. TheRDArray() function will extract an array pointer from a message at an indicated 0 based index from a RDO message. Similarly, the RDString() function extracts a string from an RDO message.

After the parameter strings have been extracted, the lot and stocker parameters are verified using the getLot() and getStocker() functions. If the lot and stocker corresponding to the respective ID are found in the MMS database, the retrieveToStocker() function sets the corresponding configurable equipment interface, or "CEI," name for the stocker and formats the stocker and output port designation into a lot structure. These two data items are passed to the send_retrieve_lot_msg() function, which performs the duty of formatting the data elements into an RDO message and sending it to the EI.

The result of the message send is captured and passed to the retrieve_to_stocker_reply() function. The responsibility of this function is to format a reply message based on the result of the EI request.

2. send_retrieve_lot_Msg()

The duties of the send_retrieve_lot_msg() function are to format the RDO message using the passed parameters, and to send the message to the EI. The code for this function is presented below. Trace data is output liberally throughout this function to allow a troubleshooter to be notified if any unusual occurrence causes the send process to fail.

```
send_retrieve_lot_msg(theGroup, theGroupName, theLot)
address    *theGroup;
char       *theGroupName;
MMS_MMS_LOT    *theLot;
{
int    res, n;
int    send_msg_len;
int    reply_msg_len = 0;
int    reply_object;
char   *reply_group, t_str[10], t_val[10];
RD_METHOD   *method;
RD_DATA    *rd_data;
RD_MSG_BYTE *send_msg_p;
RD_MSG_BYTE *reply_msg_p;
rd_data = rdom_data_create(1);
if (!rd_data) {
  trace_output("Can't create recepticle for data");
  return (-1);
}
if (format_retrieve_lot_msg(rd_data, theLot) == 0) {
  send_msg_p = rdom_msg_create(rd_data, &send_msg_len);
  if (!send_msg_p) {
    trace_output("rdo_write_msg:
    Can't create recepticle for message");
    return (-1);
  }
  strcpy(t_str, "T"); /* format timeout value as string option */
  sprintf(t_val, "%i", Max_time);
  strcat(t_str, t_val);
  trace_output("Sending retrieveToStocker message to MCS EI");
  res = cbcast_l(t_str, theGroup,
  RDOM_ENTRY_DATA, "%s %l %C",
    theGroupName, 1, send_msg_p,
    send_msg_len, 1, "%+s %l %+C",
    &reply_group, &reply_object,
    &reply_msg_r, &reply_msg_len);
  if (res < 1) {
    res = MMS_REQUEST_TIMED_OUT;
    trace_output("Stocker Retrival Request to CEI timed out.");
  } else {
    if (res == 1) res = get_rdom_result_value(reply_msg_p,
      reply_msg_len);
    sprintf(Log_str, "Result of message to MCS EI = %i,
    Reply Group = %s, Length = %i",
    res, reply_group, reply_msg_len);
    log_output(Log_str);
  }
}
return(res);
}
```

The first responsibility of the function is to create an RDO message receptacle for the message data which will be sent to the EI. If the allocation fails, trace text is output and the function is exited. After the receptacle has been successfully allocated, the passed parameters are formatted into the message using the format_retrieve_lotmsg() function. The code for this function is presented after this paragraph. After the formatting has been completed, the message receptacle is allocated. A failure of this allocation has the same results as the attempted allocation of the message data.

```
format_retrieve_lot_msg(theMsg, theLot)
RD_DATA   *theMsg;
MMS_LOT   *theLot;
{
int    res = 0;
RD_ARRAY *a_ptr;
RD_DATA *rd_data;
RD_METHOD *method;
trace_output("Formatting retrieve lot message");
method = rdom_method_create(1);
```

```
RDSetSelector(method, "mmsRetrieveToStocker:");
new_rd_array(&a_ptr, 7);
RDSetString(a_ptr, 0, theLot->lot_id);
RDSetString(a_ptr, 1, theLot->carrier_id);
RDSetString(a_ptr, 2, theLot->stocker_id);
RDSetString(a_ptr, 3, NULL_STRING);
RDSetString(a_ptr, 4, NULL_STRING);
RDSetString(a_ptr, 5, MCS_PRIORITY_normal);
RDSetString(a_ptr, 6, NO_STRING);
RDSetArray(method, 0, a_ptr);
RDSetMethod(theMsg, 0, method);
return(res);
}
```

This code provides a walk-through of the actions required to format a message to an MCS EI using the ISIS message bus. The function is passed the RDO message to format along with the parameters to format as the two input parameters, theMsg and theLot. An RDOM method is created to indicate the method selector to send to the EI. An array is created to hold the parameters which the EI expects to find in the message. The lot_id, carrier_id and stocker_id which have been passed to the function in the structure theLot, are set as string elements in the array. Other elements are set in the array before the array is set as the parameter for the method and the method is set in the message to be sent to the EI.

After all allocations and formatting have been successfully performed, the function sets the time-out value for the cbcast_l() function, which is an ISIS function provided to send messages on the ISIS message bus. The time-out value is formatted into a string which is passed as a parameter in the cbcast_l() function. The time-out value is a global variable which can be set both at MMS load time and dynamically via an ISIS message.

While the cbcast_l() function is executing, MMS is waiting for the reply. The result which is returned from the function, res, indicates the number of replies which have been returned by the EI server. The res value is used to determine whether the cbcast_l() function has timed-out waiting for the reply or whether it has executed successfully and has received a reply. In either case, log and trace output is formatted to identify the result of the message request.

If a reply has been received successfully, the get_rdom_result_value() function is called to retrieve the result code from the message reply.

The code for the get_rdom_result_value() function is listed below. This function is used by other operations which need to determine the result code for a particular EI operation. The code for this routine is found in the mms_rdom.c module.

```
get_rdom_result_value(a_ptr, lgn)
RD_MSG_BYTE  *a_ptr;
int    lgn;
{
RD_DATA   *rd_data;
RD_ARRAY  *array;
RD_METHOD *method;
int    res = -1;
rd_data = rdom_msg_convert(lgn, a_ptr);
if (rd_data != (RD_DATA *) NULL) {
  if (RDIsMethod(rd_data, 0)) {
    method = RDMethod(rd_data, 0);
    if (strcmp("isisResult", method->selector)) {
      if (RDIsArray(method, 0)) {
        array = RDArray(method, 0);
```

-continued

```
    if (RDIsInt(array, 0)) {
        res = RDInt(array, 0);
    } else {
        trace_output("RDO Returned Array element not integer");
    }
    } else {
        trace_output("RDO Returned object not array");
    }
    } else {
        trace_output("RDO Returned Method not isisResult");
    }
    }else {
        trace_output("RDO Method not returned");
    }
    rdom_data_free(rd_data);
    } else {
        trace_output("rdo_msg_convert() returned null");
    }
    return)res);
}
```

Most of the code in this function exists to validate the structure of the reply message. The integer return code is retrieved from the EI reply and returned to the caller retrieve_lot_to_stocker(). There the result must be formatted into a reply which can be sent back to the original requester. This is performed by the retrieve_lot_to_stocker_reply() function. The code for this function is presented below.

```
retrieve_to_stocker_reply(theLot, res, method)
    MMS_LOt    *theLot;
    int        res;
    RD_METHOD  *method;
{
    RD_ARRAY *a_ptr;
    trace_output("Formatting retrieve_to_stocker reply");
    new_rd_array(&a_ptr, 2);
    RDSetInt(a_ptr, 0, res);
    if (res == 0) {
        RDSetString(a_ptr, 1, MMS_OPERATION_SUCCESS);
    } else {       /* an error occurred */
        if (res == MMS_MCS_NOT_FOUND) {
            RDSetString(a_ptr, 1, MMS_MCS_EI_NOT_FOUND);
        } else {
            if (res == MMS_INVALID_MSG_FORMAT) {
                RDSetString(a_ptr, 1, MMS_INVALID_MESSAGE);
            } else {
                if (res == MMS_REQUEST_TIMED_OUT) {
                    RDSetString(a_ptr, 1, MMS_CEI_REQUEST_TIMEOUT);
                } else {
                    format_rdom_error_reply(a_ptr, res);
                }
            }
        }
    }
    RDSetArray(method, 0, a_ptr);
    return(0);
}
```

The duty of this reply function is to format the result code and a corresponding textual description of the code into an RDO message which will be returned to the requester. An RDOM array is created to hold the elements of the reply. Note that a result value of 0 indicates a successful operation. The string MMS_OPERATION_SUCCESS which is defined in the mms.h header is formatted into the response array in this condition. Other error conditions which may have occurred in processing are tested for. When the correct result value has been encountered the corresponding string is formatted into the message. After the array has been formatted, it is set as a parameter to the reply method which was passed to the function. This method is then formatted into the reply to the requester in the send_reply() function which was detailed earlier.

This concludes the message thread for the mmsRetrieveToStocker request. The implementation for this request is mirrored for other requests which require that a message be sent to an EI. By understanding the structure and processing for the message thread above, the reader will be able to readily understand the processing of all messaging to an EI in MMS.

3. Non Standard Retrieve Empties

Support for retrieval of empties which is initiated by a non standard PAM action in WorkStream is provided for in MMS. A technician will require a variable number of empty cassettes at some time. A facility is provided in WorkStream to allow the technician to indicate the number of empty cassettes which are required and the destination stocker where they should be placed.

The responsibilities of MMS in this scenario are to accept and validate the message and its parameters, search for the number of requested empty cassettes, and send a request to the proper EI to retrieve those lots to the output port. As presented earlier, an entry exists in the NONSTD_Function_Table which associates option ID 2 with the nonstd_retrieve_empties() function. When the WorkStream requester sends this option ID with the valid parameters, the psv19603() function will call the action for the request. The code for the nonstd_retrieve_empties() function is presented below. Depending on the scope of future requirements, implementing support for additional non standard PAM actions may only require a single function.

```
nonstd_retrieve_empties(rd_ptr, scrn)
    RD_ARRAY *rd_ptr;
    char     *scrn;
    {char    *scrn;
{
    int      num_mt, res = 0, found = 0;
    MMS_LOT  theLot;
    MMS_ROUTE theRoute;
    MMS_STOCKER theStocker;
    address  *gaddr_p;
    char     mt_str[100];
    trace_output("Executing PSV19603 retrieve empties request");
    num_mt = atoi(RDString(rd_ptr, 11));
    strcpy(theLot.stocker_id, RDString(rd_ptr, 9));
    strtok(theLot.stocker_id, "");
    sprintf(Log_str, "%i empties requested to stocker %s",
        num_mt, theLot.stocker_id);
    trace_output(Log_str);
    for (; (found < num_mt) && (res == 0);) {
        strcpy(theLot.stocker_id, RDString(rd_ptr, 9));
        strtok(theLot.stocker_id, "");
        /* locate an empty cassette */
        if(res = (get_empty_in_stocker(&theLot))
            != ) res = get_empty(&theLot);
        if (res == 0) {    /* an empty exists somewhere */
            strcpy(theStocker.name, theLot.stocker_id);
            strtok(theStocker.name, "");
            if ((res = get_stocker(&theStocker)) == ) {
                strtok(theStocker.cei, "");
                strcat(theStocker.cei,
                    MCS_GROUP_NAME_APPEND);
                sprintf(Log_str, "Looking for process group %s",
                    theStocker.cei);
                trace_output(Log_str);
                if(!addr_isnull(gaddr_p =
                pg_lookup(theStocker.cei))) {
                    strcpy(theLot.stocker_id, theStocker.name);
                    strcat(theLot.stocker_id, OUTPUT_PORT);
                    strcat(theLot.stocker_id, RDString(rd_ptr,10));
```

-continued

```
strtok(theLot.stocker_id, "");
trace_output("Sending retrieve lot message");
if ((res = send_retrieve_lot_msg(gaddr_p,
    theStocker.cei, &theLot)) == 0) {
    found++;
    strcpy(theLot.status, MMS_STATUS_MOVING);
    res = update_lot(theLot.lot_id, &theLot);
} else {
    if(res == MCS_UNRECOGNIZED_LOT) {
        trace_output("Removing unrecognized empty lot");
        res = remove_lot(&theLot);
    }
}
} else {
    res = MMS_MCS_NOT_FOUND;
}
}
}
sprintf(Log_str, "Result code for empty retrieval = %i", res);
trace_output(Log_str);
if (res == 100) res = 0; /* no more empties */
if (found == 1) {
    strcpy(mt_str, MMS_EMPTY_RETRIEVED);
} else {
    sprintf(mt_str, "%i, found,
    MMS_EMPTIES_RETRIEVED);
}
if ((res ==0) && (num_mt > found)) res =
    MMS_INSUFFICIENT_EMPTIES;
format_mt_retrieve_scrn(res, mt_str, scrn);
return(res);
}
```

All parameter validation for the PAMPARMS structure was performed in the psv19603() function. The non-standard-retrieve-empties function can extract the parameters and begin processing. The function extracts the number of empties and the destination stocker from the RDOM message. Then, the function loops until all empties are retrieved. Once the empties are retrieved, a screen buffer is formatted to inform the technician of the results of the request. So, the major processing performed here is the search for the empty cassettes.

The function uses two database functions: get_empty_in_stocker(); and get_empty(). The first function searches for an empty cassette in a specified stocker. If one cannot be found, get_empty() is called to find an empty cassette in any stocker. If none can be found, the loop is exited and the screen buffer is formatted indicating that all empties could not be retrieved.

When an empty cassette is found, the routine must set up for the request to be sent to the MCS EI. First, the stocker where the empty lot resides must be retrieved in order for the corresponding EI name to be determined. This is the EI which will receive the message in the "push" type operation. The request to the EI will be to "push" the empty cassette from its current store to the requested destination.

After a successful process group lookup is performed for the destination EI name, the destination stocker designation is formatted using the stocker ID and output port. These are the parameters which are required for the send_retrieve_lot_msg() function which is called to send the request to the EI. A successful result from this function causes an update of the status of the empty lot to MMS_STATUS_MOVING. This is done to prevent the next empty cassette lookup in the loop from finding the cassette which is now in the process of being moved.

The function loops until the number of empties have been retrieved or the store of empty cassettes has been exhausted. The last duty of the function is to format the result of the request in a screen buffer. This is performed by the format_empty_retrieves_scrn() function which is not included in this section. The code for this function can be viewed in the mms_pam.c module.

4. mmsRequestDestinption

The mmsRequestDestination message is sent from the MCS EI to MMS. This message is typically sent when a technician sets a lot on the input port of a stocker. The stocker reads the bar coded three-character cassette ID and sends a message to the EI requesting the destination for the lot. The MCS EI then forwards the message to MMS. MMS must determine the new location and notify the appropriate EI, the EI which is associated with the destination stocker, to update the destination of the lot.

MMS has a blocking effect on the message thread. After MMS receives the mmsRequestDestination from the MCS EI requester, it performs message parameter validation. It then determines the lot for the passed carrier ID, finds the current operation for the lot and then determines the stocker location for the operation. The associated EI for the stocker location must also be determined since this must be indicated in the updateDestination message which is sent to the EI. This effectively blocks the EI thread until MMS has completed its processing and the final reply is received.

The code for the request_destination() function details the processing which MMS must accomplish before the updateDestination message can be sent to the target EI.

```
request_destination(m_ptr, reply)
RD_METHOD *m_ptr;
RD_METHOD *reply;
{
    MMS_LOT      theLot;
    MMS_ROUTE    theRoute;
    MMS_STOCKER  aStocker, fromStocker;
    MMS_WIPLOT   theWipLot;
    MMS_OPERATION theOper;
    RD_ARRAY     *rd_ptr;
    address      *gaddr_p;
    int res, empty;
    trace_output("Request destination message received");
    res = MMS_INVALID_MSG_FORMAT;
    if(RDIsArray(m_ptr,0)) {
        rd_ptr = RDArray(m_ptr,0);
        if(RDIsString(rd_ptr, 0) &&RDIsString(rd_ptr,
            1) && RDIsInt(rd_ptr, 2)) {
            strcpy(thelot.carrier_id, RDString(rd_ptr, 0));
            strcpy(aStocker.name, RDString(rd_ptr, 1));
            strtok(aStocker.name, "-");
            strcpy(fromStocker.name, aStocker.name);
            empty = RDInt(rd_ptr, 2);
            sprintf(Log_str, "Requesting destination for tag: %s,
                stocker: %s, empty: %i",
                theLot.carrier_id, aStocker.name, empty);
            log_output(Log_str);
            if ((res = lot_for_carrier(&theLot)) == 0) { /* get lot */
                sprintf(Log_str, "Retrieving WIP lot for %s", theLot.lot_id);
                trace_output(Log_str);
                strcpy(theWipLot.lot_id, theLot.lot_id);
                if ((res = get_wiplot(&theWipLot)) == 0) {
                    if (empty == 0) {
                        res = MMS_INVALID_EMPTY_ID;
                        /* empty mapped to prod lot */
                    } else {
                        strcpy(theOper.facility, theWipLot.facility);
                        strcpy(theOper.operation, theWipLot.operation);
                        sprintf(Log_str, "Retrieving operation for %s",
                            theLot.lot_id);
                        trace_output(Log_str);
                        if ((res = get_operation(&theOper)) == 0)
                            strcpy(aStocker.name, theOper.stocker);
                        res = send_update_dest(&theLot,
```

```
        &aStocker, fromStocker.name);
    }
} else { /* remaining lot record for empty exists
    (no WIP lot) */
    if(empty == 0) {
        remove_lot(&theLot);
        get_mt_lot_num(&theLot);
        strcpy(theLot.old_carrier_id, "");
        strcpy(theLot.stocker_id, "");
        strcpy(theLot.status, "");
        add_lot(&theLot);
        /* add lot in case confirm retrieve not received */
        res = send_update_dest(&theLot,
            &aStocker, fromStocker.name);
    }
} else { /* process tne empty carrier */
    if(empty == 0) {
        get_mt_lot_num(&theLot);
        res = send_update_dest(&theLot, &aStocker,
            fromStocker.name);
    }
}
}
request_destination_reply(&theLot, res, reply);
return(0);
}
```

Although the code for the function above appears to be lengthy, the functionality can be broken down into a few major pieces. First, of course, is the parameter validation at the top of the function.

Once the parameters have been verified, the logic moves into the second block of logic which records logging data to be output and determines the lot for the carrier. When the lot is found, the associated WIP ("work in process") lot is retrieved. The WIP lot record contains the current operation for the lot. The operation record is then retrieved. The operation record contains the stocker location which is associated with the operation. Once the operation record has been retrieved, the updateDestination message can be sent to the MCS EI.

The logic that remains comprises the third block of code which pertains to empty lot handling. The first check for an empty lot is done in the WIP lot retrieval logic. This code tests whether an empty carrier is associated with a production lot. This should never occur, but must be checked for. In the event that an empty carrier is associated with a production lot, the result code is set to indicate an error and the routine is exited. MMS will then reply with the error code as the return code using the generic MS ISIS Message Handling. When the EI senses an error occurred in MMS, the MCS will be notified of an error and the lot which was placed at the input port will immediately be rejected to an output port.

If the carrier contains a valid empty lot, a unique empty lot ID is generated by MMS to identify the lot. MMS first checks to determine whether the empty lot/carrier association exists in the table. If it does it is removed, and a new lot ID is generated and added to the table. In either case, the updateDestination message must be sent to the MCS EI to indicate the new storage location for the lot.

The following is the logic required to send the updateDestination message. The first phase of this operation is handled by the send_update_dest() function. The code for this function is presented below.

```
int send_update_dest(aLot, aStocker, dest)
MM_LOT     *aLot;
MMS_STOCKER *aStocker;
char       *dest;
{
    MMS_STOCKER theStocker;
    address    *gaddr_p;
    int    res, lgn, i;
    if ((res = get_stocker(aStocker)) == 100)
        strcpy(aStocker->name, dest);
    if ((res = get_stocker(aStocker)) == 0) {
        strtok(aStocker->cei, "");
        strcat(aStocker->cei,
        MCS_GROUP_NAME_APPEND);
        strtok(aStocker->name, "");
        strcpy(theStocker.name, dest);
        if ((res = get_stocker(theStocker)) == 0) {
            strtok(theStocker.cei, "");
            strcat(theStocker.cei,
        MCS_GROUP_NAME_APPEND);
            strtok(theStocker.name, "");
            sprintf(Log_str, "MCS ei is %s", theStocker.cei);
            trace_output(Log_Log_str);
            if (!addr_isnull(gaddr_p =
                pg_lookup(theStocker.cei))) {
                res = send_updat_dest_msg(gaddr_p,
                    theStocker.cei, aLot, aStocker);
            } else {
                res = MMS_MCS_NOT_FOUND;
                sprintf(Log_str, "pg_lookup error %i", (int) gaddr_p);
                trace_output(Log_str);
                sprintf(Log_str, "MCS process group %s not found",
                    aStocker->cei);
                trace_output(Log_str);
            }
        }
    }
    return(res);
}
```

The duty of the send_update dest() function is to prepare for the actual sending of the message, which is performed by the send_update_dest_msg() function. A few preparations must be performed before the message can actually be formatted and sent. First of all, the associated EI for the destination stocker must be determined.

The EI for both the source and destination stocker EIs are determined in this routine. The dest parameter passed to this routine specifies the intended destination for the message, not for the lot. This provides for a "push" type lot movement mechanism where the stocker which currently holds the lot will receive the message to "push" the cassette to the destination stocker.

After determining the destination EI for the message, a process group lookup function is performed to verify that an ISIS message can be sent to the EI. When a valid process group address is returned, the send_update_dest_msg() function is called to send the message to the EI. The code for this function is listed below.

```
send_update_dest_msg(theGroup, theGroupName, theLot, theStocker)
address    *theGroup;
char       *theGroupName;
MMS_LOT    *theLot;
MMS_STOCKER *theStocker;
{
    int    res;
    int    reply_msg_len = 0;
    int    reply_object;
    char   *reply_group, t_str[10], t_val[10];
    int    send_msg_len;
    RD_METHOD method;
```

```
-continued

RD_DATA  *rd_data;
RD_MSG_BYTE *send_msg_p;
RD_MSG_BYTE *reply_msg_p;
res = -1;
rd_data = rdom_data_create(1);
if (!rd_data) {
  trace_output("Can't create recepticle for data");
  return (-1);
}
if (format_update_dest_msg(rd_data, theLot, the Stocker) == 0) {
  send_msg_p = rdom_msg_create(rd_data, &send_msg_len);
  if (!send_msg_p) {
    trace_output("rdo_write_msg:
    Can't create recepticle for message");
    return (res);
  }
  strcpy(t_str, "T");10 /* format timeout value as string option */
  sprintf(t_val, "%i", Max_time);
  strcat(t_str, t_val)
  trace_output("Sending update destination message to MCS EI");
  res = cbcast_l(t_str, theGroup,
    RDOM_ENTRY_DATA, "%s %l %C",
    theGroupName, 1, send_msgp,
    send_msg_len, 1, "%+s %l %+C",
    &reply_group, &reply_object,
    &reply_msg_p, &reply_msg_len);
  if (res < 1) {
    res = MMS_REQUEST_TIMED_OUT;
    trace_output("Update Destination Request to CEI timed out.");
  } else }
  if (res == 1) res = get_rdom_result_value(reply_msg_p,
    reply_msg_len);
  sprintf(Log_str, "Result of message to MCS EI =
    %i, Reply Group = %s, length = %i",
    res, reply_group, reply_msg_len);
  log_output(Log_str);
  }
}
return(res);
}
```

The above function performs three duties. First, it calls the message formatting function format_update_dest_msg (), which formats the message to be sent to the MCS EI. Since this function is very straightforward and easy to understand it is not listed here.

This function also performs a logging duty to provide an audit trail of the results of the message sent.

The third and main duty of the function is to send the message. The ISIS message is sent using the ISIS cbcast_l() function. This function is used to provide a time-out capability as MMS waits for the reply from the EI. Note that the time-out value is formatted into a string which is passed as a parameter in the cbcast_l() function. The time-out value is a global variable which can be set both at MMS load time and dynamically via an ISIS message.

The get_rdom_result_value() function retrieves the return code from the reply and returns it to the caller as an integer. This value is returned from the send_update_dest_msg() function which is then returned as the return code to the original requester via the request_destination_reply() function. This indicates to the requester the results of the mmsRequestDestination request.

IV. MMS DATABASE SUPPORT

The following is a detailed view of the implementation of MMS access to several tables in the WorkStream MMS database. Some of the MMS database functionality has been exposed in examples in the previous section regarding MMS Messaging Support. This section will review those functions, as well as others.

A. MMS Lot Table

The MMS Lot table holds the association of a lot ID to a carrier ID. When a lot is mapped, this is the table which is updated. Other information about a lot is held here, including the last known stocker location. A listing of the schema for this table, named mms_lot, is provided below.

| Column name | Type | Nulls |
| --- | --- | --- |
| mlot_lotid | char(11) | no |
| mlot_carrierid no | char(3) | no |
| mlot_oldcarrierid | char(3) | yes |
| mlot_stkr_nam | char(10) | yes |
| mlot_status | char(1) | yes |

The mlot_lotid column holds the lot ID and the mlot_carrierid column holds the carrier ID portion of the lot mapping. The mlot_old_carrierid column is used to store the prior lot mapping for the lot. The mlot_stkr_nam column holds the last known stocker location for the lot while the mlot_status column indicates whether the lot was last known to be moving, stored or output.

The support for the lot table which MMS provides is structured to be available using an ISIS message request. Utilizing the pre-built MMS generic ISIS message handling mechanism, a two-tiered approach was taken to provide this support. The first level of this support is the action routine which the parse_and_perform() function calls when the appropriate request is received. The action routine is responsible for performing message parameter validation before talking the required action.

The second the of the support is provided by the functions which actually execute the SQL query required to access the MMS database. For each presented request, both the ISIS action routine and the database action function are reviewed to present a complete view of the database functionality provided by MMS. The first supported request to be covered in this section is the mmsCreateLot: request.

1. mmsCreateLot

Support for the mmsCreateLot request is provided by the add_new_lot() action routine and the add_lot() database access function. The contents of the add_new_lot() function is presented below. This function has been identified in the global Function_Table as the function to be executed when the mmsCreateLot: request is received on the ISIS Message bus.

```
add_new_lot(m_ptr, reply)
  RD_METHOD *m_ptr;
  RD_METHOD *reply;
{
  int   res;
  MMS_LOT theLot;
  trace_output("Add lot carrier message received");
  if ( RDIsString(m_ptr, 0) && RDIsString(m_ptr, 1)) {
    strcpy(theLot.lot_id, RDString(m_ptr, 0));
    strcpy(theLot.carrier_id, RDString(m_ptr, 1));
    strcpy(theLot.old_carrier_id, "");
    strcpy(theLot.stocker id, "");
    strcpy(theLot.status, "");
    sprintf(Log_str, "Lot ID = %s, Carrier = %s", theLot.lot_id,
    theLot.carrier_id);
    trace_output(Log_str);
    res = add_lot(&theLot);
  } else {
    res = MMS_INVALID_MSG_FORMAT;
  }
  add_new_lot_reply(&theLot, res, reply);
  return(res);
}
```

In the above function, parameter validation is performed by checking the first and second elements of the array to verify that they are strings. If the parameters pass the validation, an MMS_LOT structure is initialized and prepared using the parameter strings. The address of the structure is then passed to the add_lot() function after trace text is output as diagnostic information. The result of the add_lot() function is used by the add_new_lot_reply() function to format a reply to the requester. The contents of this routine are listed later in this section. First, the add_lot() function code is reviewed below.

```
add_lot(lot)
  MMS_LOT *lot;
{
EXEC SQL BEGIN DECLARE SECTION;
  struct lotstruct l_rec;
EXEC SQL END DECLARE SECTION;
  int rc;
  /* setup for the insert */
  strcpy(l_rec.lotid,lot->lot_id);
  strcpy(l_rec.carrierid, lot->carrier_id);
  strcpy(l_rec.oldcarrierid, lot->old_carrier_id);
  strcpy(l_rec.stockerid, lot->stocker_id);
  strcpy(l_rec.status, lot->status);
  if (logging)
    exec sql begin work;
  /* perform the query */
  exec sql insert into mms_lot values (:l_rec);
  rc = sqlca.sqlcode;
  if (!(error_check("add_lot")) && (logging))
    exec sql commit work;
  /* answer the results */
  return (rc);
}
```

The elements of the passed MMS_LOT structure are copied into a lotstruct structure which has been defined for SQL operations on this table. After the structure has been initialized, an SQL transaction is begun and the SQL insert is performed and committed. The SQL error code is returned to indicate the results of the action. The transaction is not in effect unless the logging variable has been set. This variable is set when MMS initializes itself at startup time.

The error_check() function is used to write trace output text in the event an SQL execution error occurred. The result code for the insert is returned to the calling function add_new_lot(). This function calls the add_new_lot_reply() function to format the reply to the requester indicating the results of the action. The contents of this function are listed below.

```
add_new_lot_reply(theLot, res, method)
  MMS_LOT    *theLot;
  int   res;
  RD_METHOD   *method;
{
  RD_ARRAY *a_ptr;
  trace_output("Formatting add_lot reply");
  new_rd_array(&a_ptr, 2);
  RDSetInt(a_ptr, 0, res);
  if (res == 0) {
    RDSetString(a_ptr, 1, MMS_OPERATION_SUCCESS);
  } else {       /* an SQL error occurred */
    if (res == MMS_INVALID_MSG_FORMAT) {
      RDSetString(a_ptr, 1, MMS_INVALID_MESSAGE);
    } else {
      format_sql_error_reply(a_ptr, res);
    }
  }
  RDSetArray(method, 0, a_ptr);
  return(0);
}
```

The result code passed to this function is checked. A value of 0 indicates a successful operation. If the add_new_lot() function encountered an invalid parameter in the message, the corresponding textual description of the error is formatted into the reply. Otherwise, the format_sql_error_reply() function is used to format the textual description of the SQL error which occurred. The contents of this function are listed below. The code for this function can be found in the mms_rdom.c module.

```
format_sql_error_reply(a_ptr, res)
  RD_ARRAY    *a_ptr;
  int   res;
{
  char  message[MMS_SQL_MSG_LGN];
  RDSetInt(a_ptr, 0, res);
  if ((res < 0) && (rgetmsg(res, message, sizeof(message)) == 0)) {
    RDSetString(a_ptr, 1, message);
  } else {
    if(res == 100) {
      RDSetString(a_ptr, 1, MMS_SQLCA_CODE_100);
    } else {
      RDSetString(a_ptr, 1, MMS_UNKNOWN_SQL_ERROR);
    }
  }
  return(0);
}
```

This function attempts to find the associated SQL error message using the rgetmsg() function. This will format the standard SQL text for the error into the message reply. If the text for the error code cannot be found, the function sets the textual description as unknown.

The processing of all other database support provided by MMS follows the same structure as has been presented above. The structure is:

1. An action routine is defined to take the action when the request is received.
2. The action routine validates parameters in the message.
3. After parameter validation, an associated database function is called to perform the database access.
4. The result of the access is passed to a reply function which formats the result value and the corresponding textual description of the error into the reply.

2. mmsDeleteLot:carrier

Instead of adding a lot, the mmsDeleteLot:carrier message will trigger a lot deletion action by MMS. Support for the mmsDeleteLot:carrier: request is provided by the delete_lot_carrier() action routine and the remove_lot() database access function. The mmsDeleteLot:carrier function has been identified in the global Function_Table as the function to be executed when the mmsDeleteLot:carrier: request is received on the ISIS message bus.

```
delete_lot_carrier(m_ptr, reply)
  RD_METHOD *m_ptr;
  RD_METHOD *reply;
{
  int   res;
  MMS_LOT theLot;
  trace_output("Delete lot carrier message received");
  if ( RDIsString(m_ptr, 0) && RDIsString(m_ptr, 1)) {
    strcpy(theLot.lot_id, RDString(m_ptr, 0));
    strcpy(theLot.carrier_id, RDString(m_ptr, 1));
    sprintf(Log_str, "Lot ID = %s, Carrier = %s", theLot.lot_id, theLot.carrier_id);
    trace_output(Log_str);
    res = remove_lot(&theLot);
```

```
} else {
    res = MMS_INVALID_MSG_FORMAT;
}
delete_lot_reply(&theLot, res, reply);
return(res);
}
```

The structure for this action routine is the same as it is in the previous action routine. After message parameters have been validated, a structure is built to be passed to a called database access function. The results of the function are passed to a reply formatting routine which formats the result code value and a corresponding textual description into the reply. The code for the database access function remove_lot() is provided below.

```
remove_lot(lot)
    MMS_LOT *lot;
{
EXEC SQL BEGIN DECLARE SECTION;
    struct lotstruct l_rec;
EXEC SQL END DECLARE SECTION;
int rc;
/* setup for the delete */
strcpy(l_rec.lotid, lot->lot_id);
if (logging)
    exec sql begin work;
/* perform the delete */
exec sql delete from mms_lot
    where mlot_lotid = :l_rec.lotid;
rc = sqlca.sqlcode;
if (!(error_check("remove_lot")) && (logging))
    exec sql commit work;
/* answer the results */
return(rc);
}
```

The structure of this function is the same as the structure for the database access routine add_lot(). The same holds true for the reply function delete_lot_carrier_reply(). For this reason, the reply function is not listed.

3. MAP LOT PAM Action Request

Although the support for lot mapping from WorkStream is implemented as a remote control PAM action, this has little effect on the structure of the code in MMS. Since this is basically a database action which sets a lot ID and carrier ID association, all that is required is an action routine to execute when the requested remote control PAM action is received, and a database access function to fulfill the request. Since the psv10503_reply() function formats the reply for the remote control PAM action, an additional reply function is unnecessary. The rmct_map_lot() function is implemented as the action routine for this request. The source code for this function is found in the mms—pam.c module.

Message parameter type validation for the PAMPARMS structure is already provided for by the psv10503() function which calls the action routine which must only perform application specific validation on the passed parameters. In this case, the tag ID to which the lot will be mapped is checked to assure that it is a valid tag ID and that no other lot is already mapped to it. This validation is performed by the respective functions get_tag() and lot_for_carrier() which are database access functions.

```
rmct_map_lot(rd_ptr)
    RD_ARRAY *rd_ptr;
{
char    new_tag[10];
int     i, res;
MMS_LOT     theLot;
MMS_TAG     theTag;
MMS_CARRIER theCarrier;
trace_output("Executing PSV10503 Map Lot Request");
strcpy(theLot.lot_id, RDString(rd_ptr, 4));
if (theLot.lot_id[0] == 0x20) theLot.lot_id[0] = 0x00;
if (strlen(theLot.lot_id) > 0) {
    strcpy(theLot.lot_id, "");
    strcpy(theLot.old_carrier_id, "");
    strcpy(theLot.stocker_id, "");
    strcpy(theLot.status, "");
    strcpy(new_tag, RDString(rd_ptr, 9));
    strtok(new_tag, "");
    strcpy(theLot.carrier_id, new_tag);
    strcpy(theTag.id, new_tag);
    strcpy(theTag.facility, RDString(rd_ptr, 1));
    strtok(theTag.facility, "");
    sprintf(Log_str, "Checking for tag ID %s in facility %s",
        theTag.id, theTag.facility);
    trace_output(Log_str);
    if ((res = (get_tag(&theTag))) == 0) {
        lot_for_carrier(&theLot);
        if ((res = strlen(theLot.lot_id)) == 0) {
            strcpy(theLot.lot_id, RDString(rd_ptr, 4));
            strtok(theLot.lot_id, "");
            strcpy(theLot.carrier_id, new_tag);
            sprintf(Log_str, "Lot ID = %s, Tag ID = %s", theLot.lot_id,
                theLot.carrier_id);
            trace_output(Log_str);
            res = map_lot_to_carrier(theLot.lot_id, theLot.carrier_id);
        } else {
            res = MMS_CARRIER_EXISTS_FOR_LOT;
        }
    } else {
        res = MMS_INVALID_TAG_ID;
    }
} else {
    res = MMS_INVALID_LOT_ID;
}
return(res);
}
```

Code for the lot_for_carrier() function is provided to present a look at a retrieve query implementation in MMS. The database access function performs a lookup on the mms_lot database using the specified carrier ID. An additional database access function carrier_for_lot() is also provided to retrieve the lot row using the specified lot ID, but is not covered in this section.

```
lot_for_carrier(theLot)
    MMS_LOT *theLot;
{
EXEC SQL BEGIN DECLARE SECTION;
    struct lotstruct l_rec;
EXEC SQL END DECLARE SECTION;
int errnum;
/* setup for the query */
strcpy(l_rec.carrierid, theLot->carrier_id);
/* perform the query */
exec sql select *
    into :l_rec
    from mms_lot
    where mlot_carrierid = :l_rec.carrierid;
/* answer the results */
if ((errnum = error_check("lot_for_carrier")) != 0) return(errnum);
if ((errnum = sqlca.sqlcode) == 0) {
    strcpy(theLot->lot_id, l_rec.lotid);
    strcpy(theLot->old_carrier_id, l_rec.oldcarrierid);
    strcpy(theLot->stocker_id, l_rec.stockerid);
    strcpy(theLot->status, l_rec.status);
```

-continued

```
   sprintf(Log_str, "lot id: %s, carrier id: %s", l_rec.lotid, l_rec.carrierid);
   trace_output(Log_str);
   }
return(errnum);
}
```

The function assigns the carrier ID to the lotstruct element to be used in the query and performs the lookup. The result of the query is checked and trace output indicates the result of the operation. If the retrieve was successful, the passed structure is filled with the column values from the retrieved row. The query's result code is returned to the caller.

The rmct_map_lot() function verifies the non-existence of a lot association by checking the value of the lot_id portion of the passed structure. If it has not been updated, the length of the string is 0. This validates that a lot is not associated with the requested carrier. After the data has passed the application validation performed by the get_tag() and lot_for_carrier() functions, the map_lot_to_carrier() function is called to set the new lot ID, carrier ID association.

```
map_lot_to_carrier(lot_id, carrier_id)
   char *lot_id;
   char *carrier_id;
{
   int            rc;
   MMS_LOT        lot;
   MMS_CARRIER    oldCarrier, newCarrier;
   MMS_LOT_HISTORY entry;
   EXEC SQL BEGIN DECLARE SECTION;
      struct lotstruct l_rec;
   EXEC SQL END DECLARE SECTION;
   /* setup for the update */
      strcpy(lot.lot_id, lot_id);
      strcpy(lot.carrier_id, carrier_id);
      strcpy(lot.old_carrier_id, "");
      strcpy(lot.stocker_id, "");
      strcpy(lot.status, "");
      if (lot_exists(&lot) == FALSE) {
         rc = add_lot(&lot);
      } else {
         if (logging)
   exec sql begin work;
   /* perform the update */
      strcpy(l_rec.lotid, lot_id);
      strcpy(l_rec.carrierid, lot.carrier_id);
      strcpy(l_rec.oldcarrierd, lot.carrier_id);
   exec sql update mms_lot
      set (mlot_carrierid, mlot_oldcarrierid) =
          (:l_rec.carrierid, :l_rec.oldcarrierid)
      where mlot_lotid = :l_rec.lotid;
   if (logging) {
      if ((rc = sqlca.sqlcode) == 0) {
         sprintf(Log_str, "Committing lot %s to carrier %s",
                 l_rec.lotid, l_rec.carrierid);
         trace_output(Log_str);
      exec sql commit work;
         rc = sqlca.sqlcode;
         if (rc != 0) error_check("map_lot_to_carrier");
      } else {
         exec sql rollback work;
         sprintf(Log_str, "%s %i", MMS_SQL_UPDATE_ERROR, rc);
         trace_output(Log_str);
      }
   }
}
/* answer the result */
return(rc);
}
```

The map_lot_to_carrier() function contains an update query which updates the lot/carrier ID association with a new carrier ID value. However, this routine does execute additional verification before it attempts to perform the update.

After filling the structure for the SQL query, the function determines whether the lot has already been set up in the database. If it has not, this is the first time the lot was mapped to a carrier, so the lot is added to the table using the add_lot() function. Otherwise, the existing lot is updated with the new carrier ID using the SQL update query. The result of the query is checked to determine whether the transaction should be committed or rolled back. The result code value for the update is returned to the calling function. This value is returned in a reply to the requester with a corresponding textual description.

Support for the UNMAP LOT remote control PAM action is provided in MMS in a similar fashion. The code for the action routine rmct_unmap_lot() is found in the mms_pam.c module. All function required to support this function has already been reviewed. The action routine below is all that is required to implement the UNMAP LOT functionality.

```
rmct_unmap_lot(rd_ptr)
   RD_ARRAY *rd_ptr;
{
   int      res;
   MMS_LOT  theLot;
   trace_output("Executing PSV10503 Unmap Lot Request");
   strcpy(theLot.lot_id, RDString(rd_ptr, 4));
   sprintf(Log_str, "Unmapping lot %s", theLot.lot_id);
   trace_output(Log_str);
   if (lot_exists(&theLot) == TRUE) {
      res = remove_lot(&theLot);
   } else {
      strcpy(theLot.carrier_id, RDString(rd_ptr, 9));
      strtok(theLot.carrier_id, "");
      if ((strlen(theLot.carrier_id) > 0) &&
          (lot_for_carrier(&theLot) == 0)) {
         res = remove_lot(&theLot);
      } else {
         res = MMS_INVALID_LOT_ID;
      }
   }
return(res);
}
```

The preceding section has reviewed the implementation of database support of the MMS lot table in two different contexts. First, it was demonstrated that MMS provides database functionality via ISIS messages. The implementation of an ISIS message for maintenance of a MMS table requires little more than an action routine to validate and parse the received message, a database access routine which includes the SQL query to perform the action on the database, and finally a reply routine which formats the results of the action in a message to be sent to the requester.

In a second context, the context of a PAM action, MMS requires less additional code as is evidenced by the MAP LOT and UNMAP LOT functionality reviewed above. These examples have dealt with the MMS lot table. The following sections will cover additional tables which are implemented by MMS. These sections are provided to inform the reader of the implementation for access to these tables via ISIS messages.

B. MMS Tag Table 1. mmsCreateTag

Support for the mmsCreateTag request is provided by the add_new_tag() action routine and the add_tag() database access function. As in previous sections, the action routines for support of a particular table type are held in a single code module. The code for the tag action routines is found in the mms_tag.c module. Code for all of the tag database access routines are contained in the mms_db.ec module. The contents of the add_new_tag() function is presented below. This function has been identified in the global Function_Table as the function to be executed when the mmsCreateTag: request is received on the ISIS message bus.

```
add_new_tag(m_ptr, reply)
 RD_METHOD *m_ptr;
 RD_METHOD *reply;
{
 int    res;
 MMS_TAG    theTag;
 trace_output("Add Tag message received");
 if ( RDIsString(m_ptr, 0) && RDIsString(m_ptr, 1)
      && RDIsString(m_ptr, 2)) {
    strcpy(theTag.facility, RDString(m_ptr, 0));
    strcpy(theTag.id, RDString(m_ptr, 1));
    sprintf(Log_str, "Tag ID = %s", theTag.id);
    trace_output(Log_str);
    strcpy(theTag.color, RDString(m_ptr, 2));
    sprintf(Log_str, "Tag Color = %s", theTag.color);
    trace_output(Log_str);
    res = add_tag(&theTag);
 } else {
    res = MMS_INVALID_MSG_FORMAT;
 }
 add_new_tag_reply(&theTag, res, reply);
 return (res);
}
```

In the above function, parameter validation is performed by checking the first three elements of the array to verify that they are strings. If the parameters pass the validation, an MMS_TAG structure is initialized and prepared using the parameter strings. The address of the structure is then passed to the add_tag() function after trace text is output as diagnostic information. The result of the add_tag() function is used by the add_new_tag_reply() function to format a reply to the requester.

```
add_tag(tag)
 MMS_TAG *tag;
{
 EXEC SQL BEGIN DECLARE SECTION;
    struct tagstruct t_rec;
 EXEC SQL END DECLARE SECTION;
 int rc;
 /* setup for the insert */
 strcpy(t_rec.facility, tag->facility);
 strcpy(t_rec.id, tag->id);
 strcpy(t_rec.color, tag->color);
 if (logging)
    exec sql begin work;
 /* perform the query */
 exec sql insert into mms_tag values (:t_rec);
 rc = sqlca.sqlcode;
 if (!(error_check("add_tag")) && (logging))
    exec sql commit work;
 /* answer the results */
 return (rc);
}
```

The elements of the passed MMS_TAG structure are copied into a tagstruct structure which has been defined for SQL operations on this table. After the structure has been initialized, an SQL transaction is begun and the SQL insert is performed and committed. The SQL error code is returned to indicate the results of the action.

The result code for the insert is returned to the calling function add_new_tag(). This function calls the add_ new_tag_reply() function to format the reply to the requester indicating the results of the action. The contents of this function are listed below.

```
add_new_tag_reply(theTag, res, method)
 MMS_TAG    *theTag;
 int    res;
 RD_METHOD    *method;
{
 RD_ARRAY *a_ptr;
 trace_output("Formatting add_tag reply");
 new_rd_array(&a_ptr, 2);
 RDSetInt(a_ptr, 0, res);
 if (res == 0) {
    RDSetString(a_ptr, 1, MMS_OPERATION_SUCCESS);
 } else {    /* an SQL error occurred */
    if(res == MMS_INVALID_MSG_FORMAT) {
       RDSetString(a_ptr, 1, MMS_INVALID_MESSAGE);
    } else {
       format_sql_error_reply(a_ptr, res);¢
    }
 }
 RDSetArray(method, 0, a_ptr);
 return(0);
}
```

The result code passed to this function is checked. A value of 0 indicates a successful operation. If the add_new_tag() function encountered an invalid parameter in the message, the corresponding textual description of the error is formatted into the reply. Otherwise, the format_sql_error_reply() function is used to format the textual description of the SQL error which occurred.

2. mmsDeleteTag

Support for the mmsDeleteTag: request is provided by the delete_tag() action routine and the remove_tag() database access function. The contents of the delete_tag() function is presented below. As an action routine, this function has been identified in the global Function_Table as the function to be executed when the mmsDeleteTag: request is received on the ISIS message bus.

```
delete_tag(m_ptr, reply)
 RD_METHOD *m_ptr;
 RD_METHOD *reply;
{
 int    res;
 MMS_TAG    theTag;
 trace_output("Delete tag message received");
 if ( RDIsString(m_ptr, 0) && RDIsString(m_ptr, 1)) {
    strcpy(theTag.facility, RDString(m_ptr, 0));
    strcpy(theTag.id, RDString(m_ptr, 1));
    sprintf(Log_str, "Tag ID = %s", theTag.id);
    trace_output(Log_str);
    res = remove_tag(&theTag);
 } else {
    res = MMS_INVALID_MSG_FORMAT;
 }
 delete_tag_reply(&theTag, res, reply);
 return(res);
}
```

As is evident from the function above, the structure of the function is the same as it is in other action routines. After message parameters have been validated, a structure is built to be passed to a called database access function. The results of the function are passed to a reply formatting routine which formats the result code value and a corresponding textual description into the reply. The code for the database access function remove_tag() is provided below.

```
remove_tag(tag)
  MMS_TAG *tag;
{
EXEC SQL BEGIN DECLARE SECTION;
  struct tagstruct t_rec;
EXEC SQL END DECLARE SECTION;
int   res;
MMS_LOT a_lot;
/* setup for the delete */
strcpy(a_lot.carrier_id, tag->id);
lot_for_carrier(a_lot);
if (strlen(a_lot.lot_id) == 0) {
  strcpy(t_rec.facility, tag->facility);
  strcpy(t_rec.id, tag->id);
  if (logging)
    exec sql begin work;
  /* perform the delete */
  exec sql delete from mms_tag
    where mtag_facility = :t_rec.facility
      and mtag_id = :t_rec.id;
  res = sqlca.sqlcode;
  if (!(error_check("remove_tag")) && (logging))
    exec sql commit work;
  /* answer the results */
} else {
  res = MMS_CARRIER_EXISTS_FOR_LOT;
}
return(res);
}
```

The remove_tag() function determines if a lot exists for the specified carrier/tag before a delete of the row is attempted. This application requirement assures that all tags which are mapped to a lot are valid tags and are identified by a row in the MMS tag table. The validation is performed using the lot_for_carrier() function.

If a lot is not found for the carrier, the SQL delete query is attempted. The results of the query are returned to the calling function to format into a reply which will notify the requester of the results of the action. None of the reply functions have been listed in this section because their function is similar in nature to reply functions previously presented. Any tag related reply functions can be viewed in the code module mms_tag.c.

A tag update feature triggered by an ISIS message is implemented in MMS using the mmsUpdateTag: message.

3. mmsUpdateTag

Support for the mmsUpdateTag: request is provided by the change_tag() action routine and the update_tag() database access function. The contents of the change_tag() function are presented below. As an action routine, this function has been identified in the global Function_Table as the function to be executed when the mmsUpdateTag: request is received on the ISIS message bus.

```
change_tag(m_ptr, reply)
  RD_METHOD *m_ptr;
  RD_METHOD *reply;
{
int   res;
MMS_TAG   oldTag, theTag;
trace_output("Update tag message received");
if ( RDIsString(m_ptr, 0) && RDIsString(m_ptr, 1)
  && RDIsString(m_ptr, 2) &&
  RDIsString(m_ptr, 3) &&
    RDIsString(m_ptr, 4)) {
  strcpy(oldTag.facility, RDString(m_ptr, 0));
  strcpy(oldTag.id, RDString(m_ptr, 1));
  strcpy(theTag.facility, RDString(m_ptr, 2));
  strcpy(theTag.id, RDString(m_ptr, 3));
```

```
  strcpy(theTag.color, RDString(m_ptr, 4));
  sprintf(Log_str, "Old Tag ID = %s, New Tag ID = %s",
    oldTag.id, theTag.id);
  trace_output(Log_str);
  res = update_tag(&oldTag, &theTag);
} else {
  res = MMS_INVALID_MSG_FORMAT;
}
sprintf(Log_str, "%sColor = %s", theTag.color);
trace_output(Log_str);
change_tag_reply(&theTag, res, reply);
return(res);
}
```

The string parameters passed in the message represent old and new values for the tag to be changed. The old values, facility and ID, allow the correct row to be retrieved from the table for the update. Once the tag is retrieved, the new values will be used to update the columns for that row in the table. This allows all columns in the row to be updated. After message parameters have been validated, the old and new values are set in two structures to be passed to the database access function update_tag(). The results of the function are passed to a reply formatting routine which formats the result code value and a corresponding textual description into the reply. The code for the database access function update_tag() is provided below.

```
update_tag(old_ver, new_ver)
  MMS_TAG   *old_ver;
  MMS_TAG   *new_ver;
{
  MMS_TAG   temp_tag;
  int   rc;
  EXEC SQL BEGIN DECLARE SECTION;
    struct tagstruct t_rec, old_tag;
  EXEC SQL BEGIN DECLARE SECTION;
  /* setup for the update */
  if (rc = get_tag(old_ver)) return(rc);
  strcpy(old_tag.facility, old_ver->facility);
  strcpy(old_tag.id, old_ver->id);
  strcpy(t_rec.facility, new_ver->facility);
  strcpy(t_rec.id, new_ver->id);
  strcpy(t_rec.color, new_ver->color);
  if (logging)
    exec sql begin work;
  /* perform the update */
  exec sql update mms_tag
    set (mtag_facility, mtag_id, mtag_colorid) = (:t_rec.facility,
    where mtag_facility = :old_tag.facility
      and mtag_id = :old_tag.id;
    if (!(rc = error_check("update_tag")) && (logging));
  exec sql commit work;
  /* answer the results */
  return(rc);
}
```

The update_tag() function determines if the tag to be updated exists before the update is attempted. After a successful table lookup, two SQL structures are filled. The first contains the values which uniquely identify the tag, facility, and tag ID. This structure is used for the update retrieval portion of the SQL. The elements of the second structure are used to update the columns of the retrieved row. The function returns the result code of the failed validation or the SQL update to the caller, which will call a reply routine to format the code and a corresponding textual description into a reply to be sent to the requester.

C. MMS Stocker Table

Support for the stocker table includes additional message types which have not been covered in previous sections. Therefore, rather than review the add, change, and delete message support provided by MMS, the implementation of the more unique support for the stocker table is covered in this section. Direct access of the stocker table is currently implemented in the MMS Graphical User Interface which was developed in Smalltalk. This interface was created to allow administration of the stocker table, which is not a normal production activity. Once the stockers and their associated elements are defined correctly, there should be no need to add stockers or equipment to the table. The documentation in this section is included to show the MMS support that currently exists for the stockers, in case there may be some need to include additional support on the production floor for stocker table access.

1. mmsRetrieveAllStockers

This first subsection will review MMS support of the mmsRetrieveAllStockers message. This message is intended to support a request of information for all stockers and the associated equipment and to return that information to the requester. All pertinent information is packaged along with a result code indicating the result of the requested action. The action routine which is associated with this message is the retrieve_all_stockers() function which can be found in the mms_stock.c code module.

```
retrieve_all_stockers(m_ptr, reply)
   RD_METHOD *m_ptr;
   RD_METHOD *reply;
{
   int      res, max;
   MMS_STOCKER *theStockers;
   trace_output("Retrieve stocker message received");
   if ( RDIsInt(m_ptr, 0)) {
      max = RDInt(m_ptr, 0);
      sprintf(Log_str, "Maximum stockers to retrieve = %i", max);
      trace_output(Log_str);
      theStockers = (MMS_STOCKER *)
      malloc(sizeof(MMS_STOCKER) * max);
      res = get_all_stockers(&max, theStockers);
   } else {
      res = MMS_INVALID_MSG_FORMAT;
   }
   retrieve_all_stockers_reply(theStockers, max, res, reply);ç
   free((void *) theStockers);
   return(res);
}
```

The requesting message parameter is an integer which specifies the maximum number of stockers which are to be returned in the reply. A contiguous block of memory is allocated to hold the requested maximum number of stocker structures which will hold the information. The pointer to this array of structures is passed to the get_all_stockers() function for the actual retrieval. After the database action routine returns its results, the reply routine is called and the allocated memory is freed. The code for the get_all_stockers() function is presented below. It is contained in the mms_db.ec module.

The code below introduces the use of cursors in MMS. The passed stocker structure is an array to be filled with the rows retrieved from the stocker table. The routine implements a for loop to retrieve a row from the cursor until the last stocker is retrieved or until the array is completely filled. The total number of stockers retrieved is returned in the max_num parameter.

```
get_all_stockers(max_num, theStockers)
   int    *max_num;
   MMS_STOCKER *theStockers;
{
EXEC SQL BEGIN DECLARE SECTION;
   struct stockerstruct s_rec;
EXEC SQL END DECLARE SECTION;
   int    errnum;
   int    total = 0;
   MMS_STOCKER *a_stocker;
   sprintf(Log_str,"Querying for %i stockers", *max_num);
   trace_output(Log_str);
   /* setup for the query */
   a_stocker = theStockers;
   /* perform the query */
   exec sql declare all_stockers cursor for
       select * into :s_rec
       from mms_stocker;
   exec sql open all_stockers;
   for (total = 0; ((total < *max_num) && (sqlca.sqlcode == 0));
        a_stocker++) {
      /* fill the array */
      exec sql fetch all_stockers;
      if (sqlca.sqlcode == 0) {
         strcpy(a_stocker->name, s_rec.name);
         strcpy(a_stocker->cei, s_rec.cei);
         strcpy(a_stocker->status, s_rec.status);
         total++;
      }
   }
   exec sql close all_stockers;
   /* answer the results */
   if ((errnum = error_check("get_all_stockers")) != 0) return(errnum);
   *max_num = total;
   return(0);
}
```

After all stocker information has been stored in the passed array, the last duty of MMS is to package the stocker information into a reply. This is performed by the retrieve_all_stockers_reply() function which is listed next. Naturally, the array of stocker structures, the total number of stockers retrieved and the result code of the action will all be required to format the reply and are passed to the function.

```
retrieve_all_stockers_reply(theStocker, total, res, method)
   MMS_STOCKER *theStocker;
   int    total;
   int    res;
   RD_METHOD  *method;
{
   int    i,j;
   RD_ARRAY *a_ptr, *s_ptr;
   MMS_STOCKER *a_stocker;
   trace_output("Formatting retrieve_all_stockers reply");
   new_rd_array(&a_ptr, 2);
   new_rd_array(&s_ptr, total*3);
   RDSetInt(a_ptr, 0, res);
   if (res == 0) {     /* format the stockers into a single dim array */
      for (i = 0, j = 0, a_stocker = theStocker; i < total; i++, a_stocker++) {
         RDSetString(s_ptr, j, a_stocker->name);
         j++;
         RDSetString(s_ptr, j, a_stocker->cei);
         j++;
         RDSetString(s_ptr, j, a_stocker->status);
         j++;
      }
      RDSetArray(a_ptr, 1, s_ptr);
   } else {         /* an SQL error occurred */
      if (res == MMS_INVALID_MSG_FORMAT) {
         RDSetString(a_ptr, 1, MMS_INVALID_MESSAGE);
      } else }
         format_sql_error_reply(a_ptr, res);
      }
   }
   RDSetArray(method, 0, a_ptr);
   return(0);
}
```

RDO array objects are created to hold the array of stocker information which will be returned to the requester. Next, the result code is formatted into the message. If the result code is non-zero indicating a failure, only a textual description of the failure is formatted into the reply. If the retrieval action was successful, the array of stocker information is used to create a single dimension array which holds each element of each stocker. This behavior points to another possible peculiarity in a message protocol.

Up until this point the content of all replies have been predictable. A result code and corresponding textual description were typically what was included. The structure of the reply returned by MMS for this request is variable and depends on the result of the request. As indicated earlier, both the requester and the server must be aware of the structure of the messages in order for the communication to occur properly.

The total number of stockers is not returned in the reply. The assumption here is that the requester knows there are three elements of information which are returned per stocker, and that the size of the returned array can be determined. This is another example of the importance of a message protocol definition, to assure that both the requester and the server are able to process messages.

2. mmsRetrieveAllStockerEquip

The above example of cursor usage for the MMS support of retrieval of multiple rows from a table is adequate to define the structure of cursor based SQL in MMS. However, it is not the only message which the MMS GUI actually uses to present stocker information. Another message, mmsRetrieveAllStockerEquip:, retrieves all stocker equipment information for a requested stocker. The GUI utilizes these two messages by first retrieving all stockers, and then retrieving all equipment information for each stocker. When the GUI requester receives the array of stockers in its reply, it then loops through that array and requests all equipment information for each returned stocker. A detailed view of MMS support for this message is presented below.

```
retrieve_all_stocker_equip(m_ptr, reply)
 RD_METHOD *m_ptr;
 RD_METHOD *reply;
{
 int    res, max;
 MMS_EQUIPMENT *theEquipment;
 max = 0;
 trace_output("Retrieve stocker equipment message received");
 if ( RDIsString(m_ptr, 0) && RDIsInt(m_ptr, 1)) {
   max = RDInt(m_ptr, 1);
   sprintf(Log_str, "Maximum stockers to retrieve = %i", max);
   trace_output(Log_str);
   theEquipment = (MMS_EQUIPMENT *)
   malloc(sizeof(MMS_EQUIPMENT)
   * max);
   strcpy(theEquipment->stocker_name, RDString(m_ptr, 0));
   res = get_all_stocker_equipment(&max, theEquipment);
 }else {
   res = MMS_INVALID_MSG_FORMAT;
 }
 retrieve_all_stocker_equip_reply(theEquipment, max, res, reply);
 free((void *) theEquipment);
 return(res);
}
```

The structure of this action routine is very similar to that of the retrieve_all_stockers() function. In addition to validating the maximum number of equipment elements which are to be returned, the corresponding stocker parameters must be validated and formatted into a structure for the get_all_stocker_equipment() database access function which is listed below.

```
get_all_stocker_equipment(max_num, theEquipment)
 int    *max_num;
 MMS_EQUIPMENT *theEquipment;
{
 EXEC SQL BEGIN DECLARE SECTION;
   struct equipstruct e_rec;
 EXEC SQL END DECLARE SECTION;
 int    errnum;
 int    total = 0;
 MMS_EQUIPMENT *an_equip;
 sprintf(Log_str,"Querying for %i equipment in stocker %s",
   *max_num, theEquipment-
   >stocker_name);
 trace_output(Log_str);
 /* setup for the query */
 an_equip = theEquipment;
 strcpy(e_rec.stockername, theEquipment->stocker_name);
 /* perform the query */
 exec sql declare all_stocker_equip cursor for
   select * into :e_rec
   from mms_equipment
   where mequ_stkr_nam =
   :e_rec.stockername;
 exec sql open all_stocker_equip;
 for (total = 0; ((total < *max_num) && (sqlca.sqlcode == 0));
 an_equip++) {
   /* fill the array */
   exec sql fetch all_stocker_equip;
   if (sqlca.sqlcode == 0) {
     strcpy(an_equip->stocker_name, e_rec.stockername);
     strcpy(an_equip->equipment, e_rec.equipment);
     strcpy(an_equip->equipment_number, e_rec.equipmentnumber);
     strcpy(an_equip->status, e_rec.status);
     total++;
   }
 }
 exec sql close all_stocker_equip;
 /* answer the results */
 if ((errnum = error_check("get_stocker_equip")) != 0) return(errnum);
 *max_num = total;
 return(0);
}
```

Again, the above cursor-based function is very similar to its counterpart get_all_stockers(). The routine uses the max_num integer as the for loop driver to fill an array of equipment structures as they are retrieved from the cursor. Any error which may occur during the retrieval is indicated by the return code. Upon a successful retrieval, all columns for each equipment row are returned for each requested stocker.

Finally, the reply must be formatted to indicate the result of the action, and return the requested stocker equipment information. The code for the retrieve_all_stocker_equip_reply() function is presented below:

```
retrieve_all_stocker_equip_reply(theEquipment, total, res, method)
 MMS_EQUIPMENT *theEquipment;
 int    total;
 int    res;
 RD_METHOD *method;
{
 int    i,j;
 RD_ARRAY    *a_ptr, *e_ptr, *s_ptr[10];
 MMS_EQUIPMENT *an_equip;
 sprintf(Log_str, "Formatting retrieve_all_stocker_equip reply,
   res = %i", res);
 trace_output(Log_str);
 sprintf(Log_str, "Formatting %i equipment items", total);
 trace_output(Log_str);
 new_rd_array(&a_ptr, 2);
 RDSetInt(a_ptr, 0, res);
 if (res == 0) { /* format the stockers into a two dim array */
   new_rd_array(&e_ptr, total);
```

-continued

```
for (i = 0, j = 0, an_equip = theEquipment; i < total; i++, j++,
an_equip++) {
  new_rd_array(&s_ptr[i], 4);
  RDSetString(s_ptr[i], 0, an_equip->stocker_name);
  RDSetString(s_ptr[i], 1, an_equip->equipment);
  RDSetString(s_ptr[i], 2, an_equip->equipment_number);
  RDSetString(s_ptr[i], 3, an_equip->status);
  RDSetArray(e_ptr, j, s_ptr[i]);
}
RDSetArray(a_ptr, 1, e_ptr);
} else {            /* an SQL error occurred */
  if (res == MMS_INVALID_MSG_FORMAT) {
    RDSetString(a_ptr, 1, MMS_INVALID_MESSAGE
  } else {
    format_sql_error_reply(a_ptr, res);
  }
}
RDSetArray(method, 0, a_ptr);
return(0);
}
```

The code for this reply function is very similar to the get_stockers_reply() function, with an exception. The equipment information is formatted into an array of arrays. The higher level array holds each stocker's equipment information as an array of strings. Naturally, the client requester must expect to receive the message reply in this format in order for successful communication to occur.

V. FIGS. 6–16

Referring to FIG. 6, in step 110, the MMS program attempts to validate the message arguments. If validation does not occur, the MMS program in step 112 generates an error code, and moves to step 128. If validation occurs, then in step 114, the MMS program checks to see if the lot number is valid. If the lot number is not valid, then the MMS program in step 116 generates an error code, and moves to step 128. If the lot number is valid, then the MMS program in step 118 tests whether the stocker destination is valid. If the stocker destination is not valid, then in step 120 the program generates an error code, and moves to step 128. If the stocker destination is valid, then in step 122 the program sends a retrieval message to the destination stocker. In step 124 the program tests whether the retrieve was successful. If the retrieve was not successful, then in step 126 the program generates an error code, and moves to step 128. If the retrieve was successful, then in step 128 the program sends a reply message that the retrieve was successful.

Referring to FIG. 7, in step 130, the MMS program attempts to validate the message arguments. In step 132, the program tests whether the argument has an error in it. If it does, then in step 134 the program generates an error code, and moves to step 146. If there is no error in the argument, then in step 136 the program tests whether a tag exists. If it does not, then in step 138 the program generates an error code, and then moves to step 146. If a tag exists, then in step 140 the program updates the tag attributes. In step 142, the program tests whether the tag has been updated. If it has not, then in step 144 the program generates an error code, and then moves to step 146. If it has been updated, then in step 146 the MMS program constructs a reply message.

Referring to FIG. 8, in step 150, the MMS program attempts to validate the message arguments. In step 152, the program tests whether the argument has an error in it. If it does, then in step 154 the program generates an error code, and moves to step 146. If there is no error in the argument, then in step 156 the program inserts a new tag into the database. In step 158, the program tests whether the tag has been inserted. If it has not been inserted, then in step 160 the program generates an error code, and then moves to step 162. If the tag has been inserted, then in step 162 the program constructs a reply message.

Referring to FIG. 9, in step 164, the MMS program attempts to validate the message arguments. In step 166, the program tests whether the argument has an error in it. If it does, then in step 168 the program generates an error code, and moves to step 180. If there is no error in the argument, then in step 170 the program tests whether the tag to be deleted is mapped to a lot. If it is, then in step 172 the program generates an error code, and then moves to step 180. If the tag is not mapped to a lot, then in step 174 the program deletes the tag from the database. In step 176, the program tests whether the tag has been deleted. If it has not been deleted, then in step 178 the program generates an error code, and moves to step 180. If the tag has been deleted, then in step 180 the program constructs a reply message.

Referring to FIG. 10, in step 182 the MMS program attempts to validate the message arguments. If validation is not achieved, then in step 194 the program generates an error code, and moves to step 196. If validation is achieved, then in step 184, the program tests whether the cassette contains wafers, or "material". If it does not contain wafers, then in step 190, the program tests whether the cassette is mapped to a lot. If it is, then in step 194 the program generates an error code, and moves to step 196. If the cassette is not mapped to a lot, then the program moves to step 222 in FIG. 12. Referring back to step 184, if the cassette contains wafers, then in step 186, the program tests whether the cassette is mapped to a lot. If it is not mapped to a lot, then in step 194 the program generates an error code, and moves to step 196. If it is mapped to a lot, then the program moves to step 202 in FIG. 11. In step 196 the program set the destination to the outport port of the input stocker. In step 198 the program sends the request destination command to the MCS, the material control system. In step 200 the program generates a reply message.

Referring to FIG. 11, in step 202 the MMS program finds the current operation of the lot. In step 204 the program finds the stocker location for the next operation. In step 206, the program tests whether the stocker location has been found. If it has not been found, then in step 210 the program sets the destination to the current input stocker, and moves to step 212. If the stocker location was found, then in step 208 the destination is set to the found stocker location. In step 212 the program sends the destination command to the MCS. In step 214 the program tests whether the MCS successfully received the command. If it did not, then in step 216 the program sends the cassette to the output port, in step 220 generates an error code, and then moves to step 218. If the MCS successfully received the command, then in step 218 the program sends a reply message.

Referring to FIG. 12, in step 222, the MMS program tests whether an association exists between an empty cassette and an empty lot. If there is no association, then the program moves to step 226. If there is an association, then in step 224 the program removes the old empty cassette association from the database. In step 226 the program assigns an empty lot ID to the cassette. In step 228 the program adds an association of the cassette-empty-lot-ID to the database. In step 230, the program tests whether the association record was added successfully. If the record was not added successfully, then in step 232 the program generates an error code, and moves to step 236. If the record was added successfully, then in step 234 the program sets the destination to the current input stocker, in step 238 sends the destination command to the MCS, and in step 240 tests whether the MCS command was successful. If it was not successful, then in step 232 the program generates an error code, in step 236 the program sends the cassette to the output port, and then moves to step 244. In step 244 the program generates a reply message.

Referring to FIG. 13, in step 246 the MMS program attempts to validate the input arguments. In step 248, the program tests whether there is an empty cassette arriving at the outport port. If there is, then in step 252 the program removes the empty lot ID for the empty cassette, and in step 254 generates a reply message. If in step 248 there is no empty cassette arriving at the output port, then in step 250 the program updates the cassette-to-lot record with the latest destination, and goes to step 254.

Referring to FIG. 14, in step 256 the MMS program attempts to validate the message arguments. If the message arguments can not be validated, then in step 258 the program generates an error code, and moves to step 260. If the message arguments are validated, then in step 262 the program tests whether all requested empty cassettes have been retrieved. If they have, then in step 260 the program generates a reply message. If they have not been retrieved, then in step 264 the program locates an empty cassette in a local stocker. In step 266 the program tests whether the empty cassette is available. If it is, then the program proceeds to step 274. If the empty cassette is not available, then the program in step 268 attempts to locate an empty cassette in any stocker. In step 270, the program again tests whether the empty cassette is available. If it is not available, then in step 272 the program generates an error code, and moves to step 260. If it is available, then in step 274 the program sends a retrieval message to MCS. In step 276 the program tests whether the retrieval command to MCS was successful. If it was, then the program returns to step 262. If it was not successful, then in step 278 the program generates an error code, and moves to step 260.

Referring to FIG. 15, in step 280 the MMS program attempts to validate the message argument. In step 282 the program tests whether a tag exists. If a tag does not exist, then in step 284 the program generates an error code, and moves to step 296. If a tag does exist, then in step 286, the program tests whether the tag is already mapped to another lot. If it is, then in step 288 the program generates an error code, and moves to step 296. If the tag is not already mapped to another lot, then in step 290 the program adds the lot-tag association to the database. In step 292 the program tests whether the lot-tag association was added to the database. If it was not, then in step 294 the program generates an error code, and moves to step 296. If the lot-tag association was added to the database, then in step 296 the program generates a reply message.

Referring to FIG. 16, in step 298 the MMS program attempts to validate the message argument. In step 300, the program tests whether the lot exists. If it does not exist, then in step 302 the program generates an error code, and moves to step 310. If the lot does exist, then in step 304 the program deletes the lot-tag association from the database. In step 306, the program tests whether the lot-tag association has been deleted from the database. If it has not been deleted, then in step 308 the program generates an error code, and moves to step 310. If the record of the lot-tag association has been deleted, then in step 310 the program generates a reply message.

Although an illustrative embodiment of the invention has been shown and described, other modifications, changes and substitutions are intended in the foregoing disclosure. In some instances, some features of the present invention may be employed without a corresponding use of the other features. Accordingly, it is appropriate that the appended claims be construed broadly and consistently with the scope of the invention.

What is claimed is:

1. A method for tracking products within a sequence of processes, wherein the products are moved in carriers through the sequence, the products are initially arranged in groups, and the products are moved between different carriers and the carriers are moved between stockers during the sequence, comprising the steps of:

assigning a first set of identification codes to the products, a second set of identification codes to the groups, a third set of identification codes to the carriers, a fourth set of identification codes to the processes, and a fifth set of identification codes to the stockers;

associating in a first database codes of groups with codes of processes according to a status of a certain group relative to a certain process;

associating in a second database the codes of the carriers with codes of the stockers according to placement of a certain carrier in a certain stocker;

associating in a third database codes of the groups with codes of the carriers according to placement of a certain group in a certain carrier;

disassociating a code of a carrier from a code of a stocker when the carrier is removed from the stocker;

disassociating a code of a group from a code of a carrier when the group is removed from the carrier;

tracking movement of products through the sequence using the database of associated codes of groups and codes of carriers, associated codes of groups and codes of processes, and associated codes of carriers and stockers.

2. The method of claim 1, wherein the tracking step includes the steps of:

identifying a group that is associated with a carrier using the third database, responsive to an input message having a carrier code;

identifying a current process for the group using the first database; and identifying a stocker location for the current operation.

3. The method of claim 1, wherein the tracking step includes the steps of:

identifying whether a group is associated with a carrier using the third database, responsive to an input message having a code identifying a carrier and a code identifying a destination; and if a code of a group is associated with the code identifying the carrier, updating the third database with the code identifying the destination.

4. The method of claim 1, wherein the step of associating in a third database codes of the groups with codes of the carriers according to placement of a certain group in a certain carrier, includes the steps of:

responsive to a request to associate a code of a certain group with code of a certain carrier,
testing whether the code of the certain carrier is presently associated with a code of another group; and
adding an association of the code of the certain carrier with the code of the certain group to the third database if the code of the certain group is not presently associated with a code of another group.

5. The method of claim 1, wherein the third database is an extension of the first database.

6. The method of claim 1, wherein the first, second, and third databases are separate.

7. The method of claim 6, further comprising the step of transmitting messages between the databases to initiate the associating steps and the disassociating steps.

8. The method of claim 7, wherein the messages for initiating the steps of associating and disassociating are processed asynchronously.

9. The method of claim 7, wherein the messages for initiating the steps of associating and disassociating are processed synchronously.

10. An apparatus for tracking products within a sequence of processes, wherein the products are moved in carriers through the sequence, the products are initially arranged in groups, and the products are moved between different carriers and the carriers moved between different stockers during the sequence, comprising:

means for assigning a first set of identification codes to the products, a second set of identification codes to the groups, a third set of identification codes to the carriers, a fourth set of identification codes to the processes, and a fifth set of identification codes to the stockers;

means for associating in a first database codes of groups with codes of processes according to a status of a certain group relative to a certain process;

means for associating in a second database the codes of the carriers with codes of the stockers according to placement of a certain carrier in a certain stocker;

means for associating in a third database codes of the groups with codes of the carriers according to placement of a certain group in a certain carrier;

means for disassociating a code of a carrier from a code of a stocker when the carrier is removed from the stocker;

means for disassociating a code of a group from a code of a carrier when the group is removed from the carrier;

means for tracking movement of products through the sequence using the database of associated codes of groups and codes of carriers, associated codes of groups and codes of processes, and associated codes of carriers and stockers.

11. The apparatus of claim 10, wherein the means for tracking includes:

means for identifying a group that is associated with a carrier using the third database, responsive to an input message having a carrier code;

means for identifying a current process for the group using the first database; and means for identifying a stocker location for the current operation.

12. The apparatus of claim 10, wherein the means for tracking includes:

means for identifying whether group is associated with a carrier using the third database, responsive to an input message having a code identifying a carrier and a code identifying a destination; and means for updating the third database with the code identifying the destination if a code of a group is associated with the code identifying the carrier.

13. The apparatus of claim 10, wherein the means for associating in a third database codes of the groups with codes of the carriers according to placement of a certain group in a certain carrier, includes:

means for, responsive to a request to associate a code of a certain group with code of a certain carrier, testing whether the code of the certain carrier is presently associated with a code of another group; and adding an association of the code of the certain carrier with the code of the certain group to the third database if the code of the certain group is not presently associated with a code of another group.

14. The apparatus of claim 10, wherein the third database is an extension of the first database.

15. The apparatus of claim 10, wherein the first, second, and third databases are separate.

16. The apparatus of claim 15, further comprising means for transmitting messages between the databases to initiate the associating steps and the disassociating steps.

17. The apparatus of claim 16, wherein the messages for initiating the steps of associating and disassociating are processed asynchronously.

18. The apparatus of claim 16, wherein the messages for initiating the steps of associating and disassociating are processed synchronously.

19. An article of manufacture for tracking products within a sequence of processes, wherein the products are moved in carriers through the sequence, the products are initially arranged in groups, and the products are moved between different carriers and the carriers are moved between different stockers during the sequence, comprising:

a computer readable medium having instructions for causing a computer to perform the steps of assigning a first set of identification codes to the products, a second set of identification codes to the groups, a third set of identification codes to the carriers, a fourth set of identification codes to the processes, and a fifth set of identification codes to the stockers;

associating in a first database codes of groups with codes of processes according to a status of a certain group relative to a certain process;

associating in a second database the codes of the carriers with codes of the stockers according to placement of a certain carrier in a certain stocker;

associating in a third database codes of the groups with codes of the carriers according to placement of a certain group in a certain carrier;

disassociating a code of a carrier from a code of a stocker when the carrier is removed from the stocker;

disassociating a code of a group from a code of a carrier when the group is removed from the carrier;

tracking movement of products through the sequence using the database of associated codes of groups and codes of carriers, associated codes of groups and codes of processes, and associated codes of carriers and stockers.

* * * * *